United States Patent
Takeuchi et al.

(10) Patent No.: US 6,476,539 B1
(45) Date of Patent: *Nov. 5, 2002

(54) PIEZOELECTRIC/ELECTROSTRICTIVE DEVICE

(75) Inventors: Yukihisa Takeuchi, Aichi-Prefecture (JP); Tsutomu Nanataki, Toyoake (JP); Masato Komazawa, Nagoya (JP); Koji Kimura, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/642,861

(22) Filed: Aug. 21, 2000

Related U.S. Application Data

(63) Continuation-in-part of application No. 09/473,835, filed on Dec. 28, 1999.

(30) Foreign Application Priority Data

| Oct. 1, 1999 | (JP) | 11-281522 |
| Oct. 28, 1999 | (JP) | 11-307844 |
| Nov. 16, 1999 | (JP) | 11-326195 |
| Dec. 27, 1999 | (JP) | 11-371967 |
| Jul. 6, 2000 | (JP) | 2000-204758 |

(51) Int. Cl.[7] ............................................. H01L 41/08
(52) U.S. Cl. ........................................ 310/330; 310/331
(58) Field of Search ................................. 310/328, 330, 310/331, 332, 366, 321

(56) References Cited

U.S. PATENT DOCUMENTS 6,109,104 A * 8/2000 Fukada et al. ........... 73/504.13
6,140,739 A * 10/2000 Arai et al. .................. 310/321

* cited by examiner

*Primary Examiner*—Mark O. Budd
(74) *Attorney, Agent, or Firm*—Burr & Brown

(57) ABSTRACT

Provided is a piezoelectric/electrostrictive device comprising a driving portion to be driven by a displacement of a piezoelectric/electrostrictive element, a movable portion to be operated based on a drive of the driving portion, and a fixing portion for holding the driving portion and the movable portion, the fixing portion and the movable portions being coupled via the driving portion, and a hole being formed by an inner wall of the driving portion, inner wall of the movable portion, and inner walls of the fixing portion. The driving portion comprises a pair of mutually opposing thin plate portions and at least two piezoelectric/electrostrictive elements each comprising at least one or more pairs of electrodes and a piezoelectric/electrostrictive layer provided on the thin plate portions.

23 Claims, 18 Drawing Sheets

CERAMIC GREEN SHEET 2 FOR THIN PLATE

HOLED CERAMIC GREEN SHEET 4

HOLED CERAMIC GREEN SHEET 3

HOLED CERAMIC GREEN SHEET 2

HOLED CERAMIC GREEN SHEET 1

CERAMIC GREEN SHEET 1 FOR THIN PLATE

1

PIEZOELECTRIC/ELECTROSTRICTIVE DEVICE

CROSS-REFERENCE TO RELATED APPLICATION

This is a continuation-in-part application of U.S. Ser. No. 09/473,835 filed on Dec. 28, 1999, the entirety of which is incorporated herein by reference.

BACKGROUND OF THE INVENTION AND RELATED ART STATEMENT

The present invention relates to a piezoelectric/electrostrictive device comprising a movable portion being operated based on a displacement of a piezoelectric/electrostrictive element, or a piezoelectric/electrostrictive device capable of detecting a displacement of a movable portion by a piezoelectric/electrostrictive element, and more particularly relates to a piezoelectric/electrostrictive device which is superior in mechanical strength, impact resistance, and humidity resistance and is capable of having the movable portion efficiently operated in a large magnitude.

In recent years, in the fields of optics and magnetic recording, precision machining, and the like, a displacement element capable of adjusting an optical path length and position in sub-micron order has been required, and development has been progressed of the displacement element utilizing displacement due to the inverse piezoelectric effect or the electrostrictive effect caused when a voltage is applied to a piezoelectric/electrostrictive material (for example, a ferroelectric substance or the like). For example, as shown in FIG. 14, a piezoelectric actuator 21, in which a fixing portion 25, a movable portion 24, and a beam 26 connecting the two are integrally formed by providing a hole 28 on a plate-like body composed of a piezoelectric/electrostrictive material, and an electrode layer 22 is provided on the beam 26, is disclosed (in the official gazette of Japanese Patent Application Laid-Open No. 10-136665). In the actuator 21, when a voltage is applied to an electrode layer 22, the beam 26 expands or contracts in a direction in which the fixing portion 25 is connected with the movable portion 24 by the inverse piezoelectric effect or the electrostrictive effect, thus making it possible to have the movable portion 24 perform an arc-shaped displacement or a rotational displacement in the plane of the plate-like body.

On the other hand, JP-A-63-64640 discloses a technique with regard to an actuator utilizing a bimorph, in which an electrode of the bimorph is split, and by selecting the split electrodes to drive the actuator, precise positioning is performed at a high speed, and for example, the specification shows in FIG. 4 thereof a structure which uses two bimorphs opposed to each other.

However, in the above-described actuator 21, as the displacement in an expanding or contracting direction (namely, the in-plane direction of the plate-like body) of a piezoelectric/electrostrictive material is transmitted per se to a movable portion, there is a problem that an operational quantity of the movable portion 24 is small. Further, the actuator 21, having all the members thereof being composed of a piezoelectric/electrostrictive material which is fragile and comparatively heavy, has another problem, in addition to being low in mechanical strength, and inferior in handling, impact resistance and humidity resistance, that the actuator 21 per se is heavy and is operationally likely to be subjected to an influence of harmful vibrations (for example, residual vibrations or noise vibrations when operated at a high speed).

In order to solve the above-described problems in the actuator 21, a proposition has been made that an elastic filling material is filled into a hole 28. However, when the filling material is used, it is apparent that the efficiency of displacement due to the inverse piezoelectric effect or the electrostrictive effect is decreased.

On the other hand, what is shown in FIG. 4 of the laidopen specification of JP-A-63-64640 is the structure wherein so-called piezoelectric/electrostrictive portions, which generate displacement, bridge over both of the respective bonding portions in the bonding manner between the intermediary member and the bimorph, and the head and the bimorph; that is, the bimorph is formed continuously over from the intermediary member to the head. Therefore, there is observed an interference between the displace movement that occurs from the bonded portion between the intermediary member and the bimorph, and the displace movement that occurs from the bonded portion between the head and the bimorph as a fulcrum, thereby the expression of the displacement is prohibited. As a result, an action for effectively displacing the head per se toward the outer space is unable to be obtained. In addition, the actuator disclosed in JP-A-63-64640 is so structured that a displacement generating member and a so-called frame member (intermediary member or the like) are separately prepared, and then adhered to be incorporated, and consequently the bonded state of the frame with the bimorph is so structured to be likely to vary with time in accordance with operation of the bimorph, and also to be likely to cause drifting, exfoliation, or the like. Further, a bonded portion of the bimorph with the intermediary member and a bonded portion of the head with the bimorph, namely a structure having an adhesive agent at a supporting portion of a displacement member, is low in rigidity of the supporting portion, and is so structured that an increase in resonant frequency which is required in high speed operation is also difficult to be obtained.

Of a piezoelectric/electrostrictive device capable of solving such problems, although the applicant of the present invention and others have proposed, in the specification of the Japanese Patent Application No. 11-375581 filed on Dec. 28, 1999, a piezoelectric/electrostrictive device capable of obtaining a large displacement quantity as well as maintaining mechanical strength of a joined portion of a thin plate portion with the movable portion above a predetermined level, a device capable of generating still larger displacement and responding at a higher speed is sought after particularly for precise positioning in the magnetic recording field and optical field.

The present invention is made in view of above-described current situation, and an object thereof is to provide a displacement element which is capable of further increasing a displacement quantity of a movable portion while maintaining the mechanical strength at the joined portion of the thin plate portion with the movable portion above a predetermined level, as well as high in resonant frequency and superior in responsibility, and a sensor element capable of detecting vibrations of the movable portion in finer precision.

SUMMARY OF THE INVENTION

According to the present invention, firstly provided is a piezoelectric/electrostrictive device comprising a driving portion to be driven by displacement of a piezoelectric/electrostrictive element, a movable portion to be operated based on the drive of the driving portion, and a fixing portion for holding the driving portion and the fixing portion, the fixing portion and the movable portion being coupled together via the driving portion, and a hole being formed by inner walls of the driving portion, an inner wall of the movable portion, and an inner wall of the fixing portion, in which the driving portion is composed of a mutually opposed pair of thin plate portions and at least two piezoelectric/electrostrictive elements provided on the thin plate portions; each of said piezoelectric/electrostrictive elements being comprised of one or more pairs of electrodes and a piezoelectric/electrostrictive film; at least one of ends of said piezoelectric/electrostrictive element and a piezoelectric/electrostrictive operating portion on said at least one of ends are positioned on the fixing portion, and formed as being extended to at least a part of either one of the thin plate portions out of said pair of the thin plate portions, and an end of said piezoelectric/electrostrictive operating portion on another side of said piezoelectric/electrostrictive element is positioned on said either one of the thin plate portions, in a direction of said one of the thin plate portions from the fixing portion toward the movable portion, in one out of at least two piezoelectric/electrostrictive elements comprising at least one or more pairs of electrodes and a piezoelectric/electrostrictive film, at least one of the ends of said piezoelectric/electrostrictive element and a piezoelectric/electrostrictive operating portion on said at least one of the ends are positioned on the movable portion, and formed being extended to at least a part of another thin plate portion out of said pair of the thin plate portions, and an end of said piezoelectric/electrostrictive operating portion on another side of said piezoelectric/electrostrictive element is positioned on said another thin plate portion, in a direction of said another thin plate portion from the fixing portion toward the movable portion, in one of remaining piezoelectric/electrostrictive elements among said piezoelectric/electrostrictive elements comprising at least one or more pairs of electrodes and a piezoelectric/electrostrictive film.

According to the present invention, further provided is a piezoelectric/electrostrictive device in which the piezoelectric/electrostrictive element comprising one or more pairs of electrodes and a piezoelectric/electrostrictive film is further arranged on the outer surface of at least either one thin plate portion out of a pair of mutually opposing thin plate portions and has a structure, in a direction of the thin plate portion from a fixing portion toward a movable portion, at least one end of the piezoelectric/electrostrictive element and a piezoelectric/electrostrictive operating portion of the same end side thereof are arranged on the fixing portion or the movable portion, and formed being extended to at least a part of the thin plate portion, and an end of the piezoelectric/electrostrictive operating portion of the other end side of the piezoelectric/electrostrictive element is arranged on the thin plate portion, and the piezoelectric/electrostrictive element is arranged on the same thin plate portion opposing to one of the at least two piezoelectric/electrostrictive elements arranged so as to be in diagonal directions across a hole; and a piezoelectric/electrostrictive device in which, on respective outer surfaces of a pair of mutually opposing thin plate portions, in a direction of the thin plate portions from the fixing portion toward the movable portion, a piezoelectric/electrostrictive element comprising at least one or more pairs of electrodes and a piezoelectric/electrostrictive film, one end of the element and one end of a piezoelectric/electrostrictive operating portion positioned on said one end of the element being arranged on the fixing portion, and a piezoelectric/electrostrictive element comprising at least one or more pairs of electrodes and a piezoelectric/electrostrictive film, one end of the element and one end of a piezoelectric/electrostrictive operating portion positioned on said one end of the element being arranged on the movable portion, are respectively arranged mutually opposed on the same thin plate portion being extended until at least a part of said thin plate portion, the respective piezoelectric/electrostrictive elements having one end thereof and piezoelectric/electrostrictive operating portions on the same end side thereof are arranged on the fixing portion or the movable portion, and formed being extended to at least a part of the thin plate portion, and an end of a piezoelectric/electrostrictive operating portion of the other end side of the piezoelectric/electrostrictive element is arranged on the thin plate portion.

Furthermore, according to the present invention, provided are a piezoelectric/electrostrictive device in which ends of piezoelectric/electrostrictive operating portions on the thin plate portions of respective piezoelectric/electrostrictive elements provided mutually opposed on the outer surfaces of the same thin plate portions are arranged in positions not to exceed one half of the lengths of respective thin plate portions; a piezoelectric/electrostrictive device in which two piezoelectric/electrostrictive elements provided mutually opposed on the outer surface of the same thin plate portion share a piezoelectric/electrostrictive film; a piezoelectric/electrostrictive device in which two piezoelectric/electrostrictive elements provided mutually opposed on the outer surface of the same thin plate portion out of a pair of mutually opposing thin plate portions are elements mutually having the same or different functions; a piezoelectric/electrostrictive device in which two piezoelectric/electrostrictive elements provided mutually opposed on the outer surface of the same thin plate portion out of a pair of mutually opposing thin plate portions are elements having mutually different functions; a piezoelectric/electrostrictive device in which piezoelectric/electrostrictive elements existing mutually in diagonal directions across a hole out of at least two piezoelectric/electrostrictive elements provided on the outer surface of a pair of mutually opposing thin plate portions are elements having the same function, and a piezoelectric/electrostrictive device in which piezoelectric/electrostrictive elements existing in mutually diagonal directions across a hole out of at least two piezoelectric/electrostrictive elements provided on the outer surfaces of a pair of mutually opposing thin plate portions are elements having mutually different functions, and a piezoelectric/electrostrictive device in which at least one piezoelectric/electrostrictive element out of at least two piezoelectric/electrostrictive elements provided on the outer surfaces of a pair of mutually opposing thin plate portions has a multi-layered piezoelectric/electrostrictive operating portion.

In the present invention, it is observed that suppression of the rotation-mode displacement is a matter of great importance in a structure of a unique device disclosed in this specification, in view of enlarging displacement quantity of the movable portion and increasing efficiency of the displacement.

The rotation-mode herein means a displacement mode of a device as a whole; said displacement mode being obtainable by making a radius of curvature of one thin plate portion out of a pair of mutually opposing thin plate portions when said one thin plate portion over a whole length there is compulsively bent (hereinafter thus formed radius of curvature referred to as compulsive radius of curvature) smaller than that of another thin plate portion which is positioned on the opposite side of the center of curvature of the compulsive radius of curvature of said one thin plate portion when said another thin plate portion is bent according to the compulsive bent of said one thin plate portion. In other words, it is called a rotation-mode because a movable portion seems as if to largely rotate about a fixing portion.

In the rotation-mode, a distance of a point of the movable portion prior to and after the displacement is a function of the above-described compulsive radius of curvature and separation distance of a pair of mutually opposing thin plate portions. That is, the smaller the compulsive radius of curvature is (namely, the larger the bending of the thin plate portions is in the entire length), and the smaller the separation distance is, the larger the displacement distance becomes.

However, the separation distance cannot be made zero, as it is required in order to secure compulsive radius of curvature. In other words, there should be an allowance to allow one thin plate portion out of a pair of thin plate portions to be compulsively bent relative to the other thin plate of the pair of thin plates. The allowance can be made practically zero by using only one thin plate portion, however, such structure is undesirable in view of stability of the device, and in any case there is an upper limit.

As a movable portion displaces as if to largely rotate about a fixing portion as described previously, inner walls of the movable portion are made to form an angle relative to the fixing portion prior to and after the displacement.

As to such problem, the present invention provides a method to enable the movable portion to efficiently develop a large displacement by changing the displacement form of a thin plate portion to a displacement mode having a point of inflection existing on the thin plate portion, more specifically, having the point of inflection existing on the thin plate portion so as to have the curvature center for the bending existing on both sides of the thin plate portion interposed therebetween, at both portions of the thin plate portion having the point of inflection interposing therebetween, thus making a displacement mode for the device as the entirety, namely a rotational symmetric mode, which is a characteristic of the present invention.

This can be described that a method is found to deform a thin plate portion in an S-shape with a point of inflection existing on the thin plate portion, by bending a part of the thin plate portion containing a connecting portion of the thin plate portion with the fixing portion, or a connecting portion of the thin plate portion with the movable portion.

The rotational symmetric mode used herein means a displacement mode which can be most efficiently obtained when an S-shape of one thin plate portion out of a pair of mutually opposing thin plate portions is rotationally symmetric to the other thin plate portion using a hole formed by respective inner walls of the movable portion, driving portion, and fixing portion as the symmetric center of the rotational symmetry.

Although a distance of a point of the movable portion prior to and after the displacement at this time is a function of radius of curvature of the bent portion of the thin plate portion and a position of point of inflection on the same thin plate portion, the degree of freedom is high as there is no limitation factor being contrary to each other in a case of the rotational mode (whereas the entire length of the thin plate portion is desired to be bent, separation distance between a pair of thin plate portions which is a space for bending thereof is preferred to be smaller). This is better suited for efficiently developing a larger displacement, as bending even small parts of the thin plate portions can be utilized.

Further, contrary to the rotational mode, as an inner wall surface of a movable portion prior to displacement and the inner wall surface of the movable portion after the displacement maintain a paralleling state prior to and after the displacement, no unfavorable influence is given to the operation efficiency of other elements placed on the movable portion, thus a large displacement can be efficiently achieved.

In this way, as a concrete means for realizing the rotationally symmetric mode, at least two piezoelectric/electrostrictive elements and piezoelectric/electrostrictive operating portions thereof, of which respective ends are arranged on the movable portion or the fixing portion, and the other ends are arranged on the thin plate portions, are arranged so as to be in mutually diagonal directions at least with a hole interposing therebetween, for the above-described pair of mutually opposing thin plate portions. Thus, a displacement of the movable portion in the rotational mode is effectively suppressed, and as a result, a piezoelectric/electrostrictive device which develops an extremely large displacement in one axis direction is realized.

A piezoelectric/electrostrictive device of the present invention preferably comprises a movable portion, thin plate portions, and a fixing portion integrally formed in ceramics, and more preferably is made of materials containing fully-stabilized zirconia as the major component or materials containing partially stabilized zirconia as the major component, and most preferably at least the movable portion, the thin plate portions, and the fixing portion are made in a sintered ceramic green laminated body. This is because connecting portions with the movable portion, the thin plate portions, and the fixing portion can be made as a borderless structure by sintering integration, thus improving long term reliability of such portions over time, and in addition a phenomenon such as drifting or the like which is a variation with time of displacement as a device can be suppressed to the minimum, thus developing a large displacement with good reproducibility. Fabricating methods of the device according to the present application will be described later in detail.

By the way, when fabricating a device of a structure according to the present application, another method in addition to complete integration by sintering is that a laminated body divided in a mutually opposing direction of the thin plate portions, namely, a ceramic laminated body comprising a thin plate portion and a member to be a rectangular fixing portion and movable portion is prepared, a piezoelectric/electrostrictive element is formed by screen printing so as to overlap the thin plate portions and the fixing portion or the movable portion of the ceramic laminated body, at least two sintered structures integrated with the ceramic laminated body by sintering are prepared, and the sintered structures are adhered to so as to have the thin plate portions mutually away, that is, the above-described members that provide the fixing portion and the movable portion are mutually adhered to by use of an adhesive (for example, an organic adhesive such as epoxy resin, acrylic resin, or the like, and an inorganic adhesive such as glass, cement, or the like). However, since the device fabricated all in one by sintering is superior in stability and reliability even if a stress is applied to a device by operation of a driving portion, as it has no discontinuous portion of a so-called structured body such as a bonded portion where a third party intervenes, it is preferable to form the device by sintering integration where no adhesive or the like is used.

Further, in a piezoelectric/electrostrictive device according to the present invention, it is preferable that a piezoelectric/electrostrictive film comprising a piezoelectric/electrostrictive element is made of the material whose major component is a mixture of lead zirconate, lead titanate, and lead magnesium niobate, and also preferable is one made of materials containing sodium bismuth titanate. Details of materials to be used will be described later.

It should be noted that "a piezoelectric/electrostrictive device (hereinafter referred to only as a "device")" in the present specification is a notion to imply an element mutually converting an electric energy and a mechanical energy by way of a piezoelectric/electrostrictive material. Therefore, the device is preferably used as an active element such as a variety of actuators, vibrators, or the like, and more specifically as a displacement element utilizing a displacement due to the inverse piezoelectric effect or the electrostrictive effect. However, it can also be used as a passive element such as an acceleration sensor element, an impact sensor element, or the like. It should also be noted that "piezoelectric" in the present specification means "piezoelectric/electrostrictive". Further, a "length" means a distance in a direction connecting a movable portion with a fixing portion, namely in the Z-axis direction in the drawings, a "width" means a distance in a direction penetrating through a hole, namely in the Y-axis direction in the drawings, and a "thickness" means a distance in a laminating direction of a piezoelectric/electrostrictive element with a thin plate portion, namely in the X-axis direction in the drawings.

A piezoelectric/electrostrictive element means an element comprising at least one or more pairs of electrodes and a piezoelectric/electrostrictive film to be driven based on signals transmitted, and to perform a function of conveying the movement thereof to a movable portion. In the element, a piezoelectric operating portion means, the substantial operable portion of a piezoelectric/electrostrictive element so as to move a movable portion in a predetermined movement in accordance with an applied signal to a driving portion, and comprises a portion where at least one or more pairs of electrodes and a piezoelectric/electrostrictive film are mutually overlapped. Further, a base for a device means a sintered ceramic laminated body prior to arrangement of a piezoelectric/electrostrictive element thereon. In addition, in the present invention, displacement quantity of a device is measured by a laser Doppler vibrometer (made by Graphtec Corp.).

BRIEF DESCRIPTION OF THE DRAWINGS

FIG. 1(a) shows a state prior to a displacement and FIG. 1(b) shows a state after the displacement.

FIG. 3(a) shows a state prior to a displacement and FIG. 3(b) shows a state after the displacement.

FIG. 12(a) is a perspective view and FIG. 12(b) is a top view.

FIG. 13(a) is a perspective view.

BEST MODE OF CARRYING OUR THE INVENTION

Figure 1A:
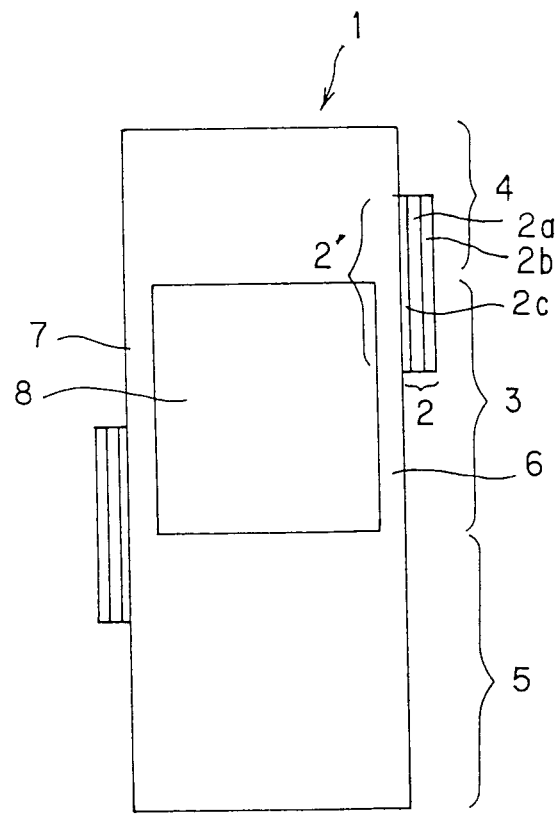
FIGS. 1(a) and (b) show front views schematically depicting a structure of an embodiment of one of piezoelectric/electrostrictive devices of the present invention.

A piezoelectric/electrostrictive device according to the present invention is hereinafter described with reference to the drawings. It should be noted, however, that the present invention is not limited to embodiments shown in the drawings.

Please be noted that those having the same or similar function are, in principle, denoted by the same symbol in the drawings.

If a device according to the present invention is classified in accordance with arrangement of piezoelectric/electrostrictive elements, there are three aspects as follows.

Figure 1B:
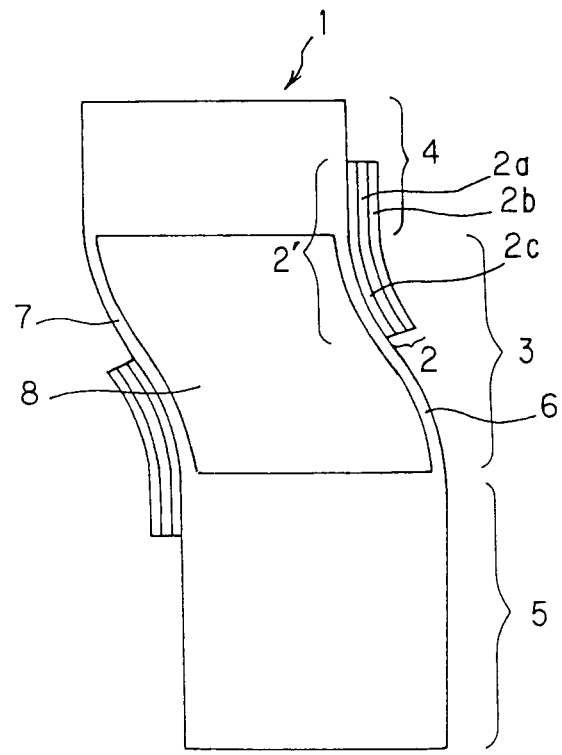

A first aspect is a device where a piezoelectric/electrostrictive element 2 comprising a pair of electrodes 2b, and 2c and a piezoelectric/electrostrictive film 2a is respectively formed on each thin plate portion out of a pair of mutually opposing thin plate portions 6, and 7, placed in diagonal directions across a hole 8. An example of the aspect is shown in FIGS. 1(a) and (b). Here, FIG. 1(a) shows a state prior to a displacement, and FIG. 1(b) shows a state after the displacement. In this aspect, it is preferable to form piezoelectric/electrostrictive elements all having the same functions, for example, a strain direction of a piezoelectric/electrostrictive operating portion relative to a main surface direction of the thin plate portion being the same. The reason is that a large displacement can be obtained by a small driving force in the structure. It is preferable, from a viewpoint of obtaining a large displacement, that an end located on a thin plate portion 6 or 7 of the piezoelectric/electrostrictive operating portion exists in a position so as to occupy 30 to 95% of the length of the thin plate portion 6, in a direction of the thin plate portion 6 from a fixing portion 5 toward a movable portion 4; 40 to 90% is more preferable. Meanwhile, in a case a piezoelectric/electrostrictive film in the above-described piezoelectric/electrostrictive element is formed beyond the thin plate portion and over the movable portion and the fixing portion, the end of the operating portion preferably exists in a position occupying 50±40%, more preferably 50±25%, of the length of the thin plate portion 6, in order to obtain a large displacement with a small driving force.

Figure 2:
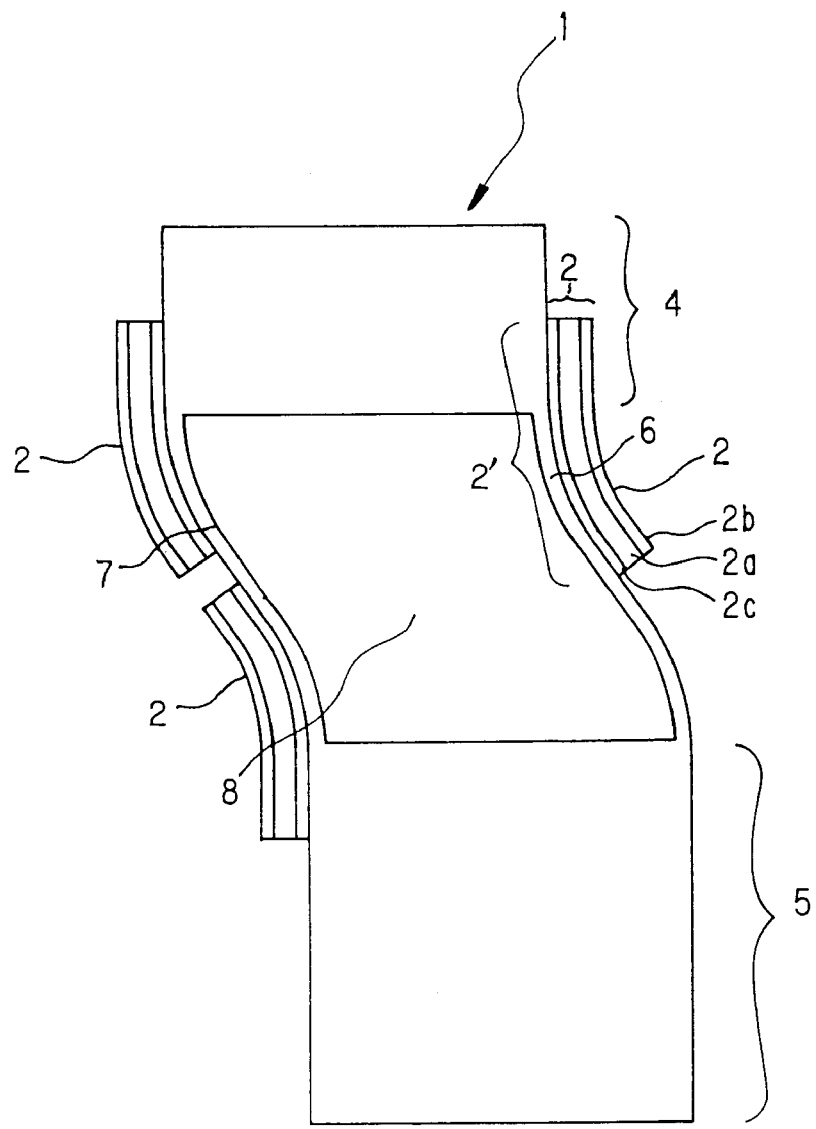
FIG. 2 shows a front view schematically depicting a structure of another embodiment of a piezoelectric/electrostrictive device of the present invention.

A second aspect is a device where, on a pair of mutually opposing thin plate portions 6 and 7, one piezoelectric/electrostrictive element is further formed in an opposing position on the thin plate portion 6 or 7 where either one of piezoelectric/electrostrictive elements each comprising a pair of electrodes 2b and 2c and a piezoelectric/electrostrictive film 2a is respectively formed already, in diagonal directions across a hole 8. As an example of the second aspect, FIG. 2 shows an embodiment where one piezoelectric/electrostrictive element is further formed in an opposing position on the thin plate portion 7. Of course, another piezoelectric/electrostrictive element may be further formed in an opposing position on the thin plate portion 6. It becomes also possible to perform a more complicated displacement by feeding mutually different instructions, for example, electric signals, respectively to these three piezoelectric/electrostrictive elements.

Figure 3A:
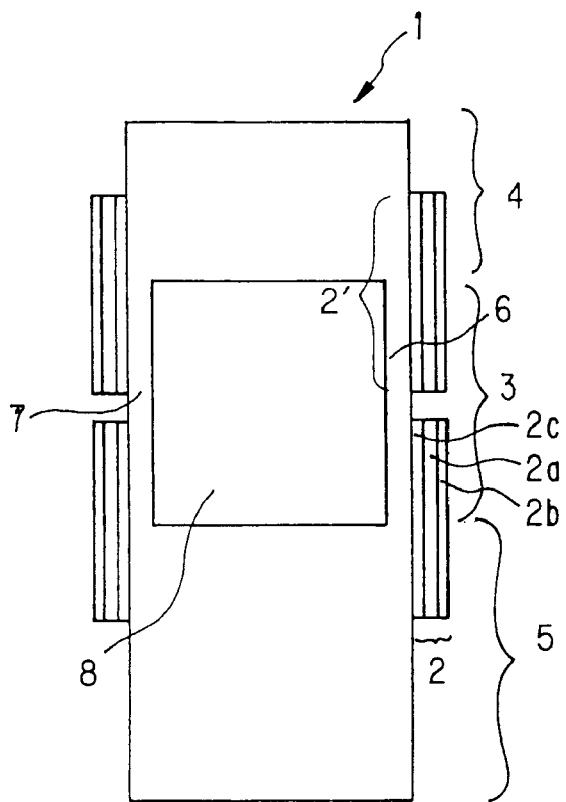
FIGS. 3(a) and (b) show front views schematically depicting structures of still another embodiment of a piezoelectric/electrostrictive device of the present invention.

In a third embodiment, as shown in FIGS. 3(a) and (b), a device is mounted with two each, four in total, piezoelectric/electrostrictive elements respectively comprising a pair of electrodes 2b, and 2c and a piezoelectric/electrostrictive film 2a mutually opposed on the same thin plate portions 6, and 7, and therefore four fulcrums are available for a displacement. So, if elements positioned at least in diagonal directions across a hole mutually have the same functions, driving force can be doubled by simultaneously driving the same, thus the driving force can be efficiently converted into a displacement in addition to remarkable increase in displacement quantity. Further, by forming piezoelectric/electrostrictive elements having mutually different strain directions formed on the same driving portion (thin plate portion), the displacement of the thin plate portion due to the strain such as expansion and/or contraction can be carried by respective piezoelectric/electrostrictive elements, thus enabling a movable portion to operate dominantly in a lateral direction, namely in the X-axis direction.

Figure 3B:
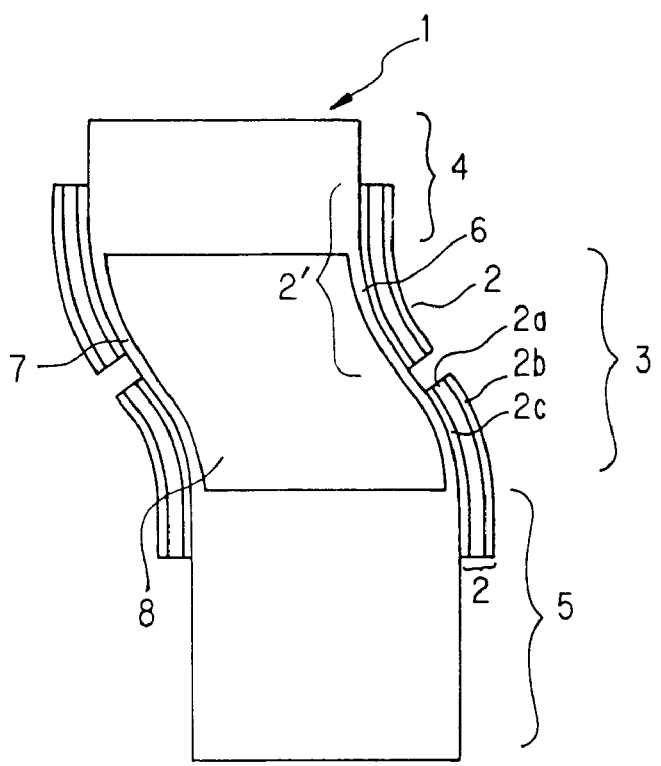

In addition, in this aspect, since piezoelectric/electrostrictive operating portions of piezoelectric/electrostrictive elements are formed on a joined portion of a fixing portion and a movable portion with a thin plate portion, the mechanical strength at the portion is also secured. Further, even if the device may be so structured that all the four piezoelectric/electrostrictive elements utilize the same effect, using a piezoelectric material having a relatively high coercive electric field, by driving one side of the piezoelectric/electrostrictive elements, formed on the same driving portion, in the electric field opposite to the polarization direction within the coercive electric field, the expansion/contraction relation can be made the same as the case when positioning relation of the four piezoelectric/electrostrictive elements is changed, which can be preferably employed. FIG. 3(a) shows a state prior to a displacement, and FIG. 3(b) shows a state after the displacement. In this aspect, it can also be advantageously employed that two piezoelectric/electrostrictive elements provided mutually opposed on the outer surface of the same thin plate portion share a piezoelectric/electrostrictive film. By doing in this way, a resonant frequency can be further increased as well as the mechanical strength of the device can be increased.

1. Embodiment of Device

Configuration, in the present invention, of a base 1' for a device which is a sintered ceramic laminated body prior to providing a piezoelectric/electrostrictive element thereon is hereinafter described.

Figure 4:
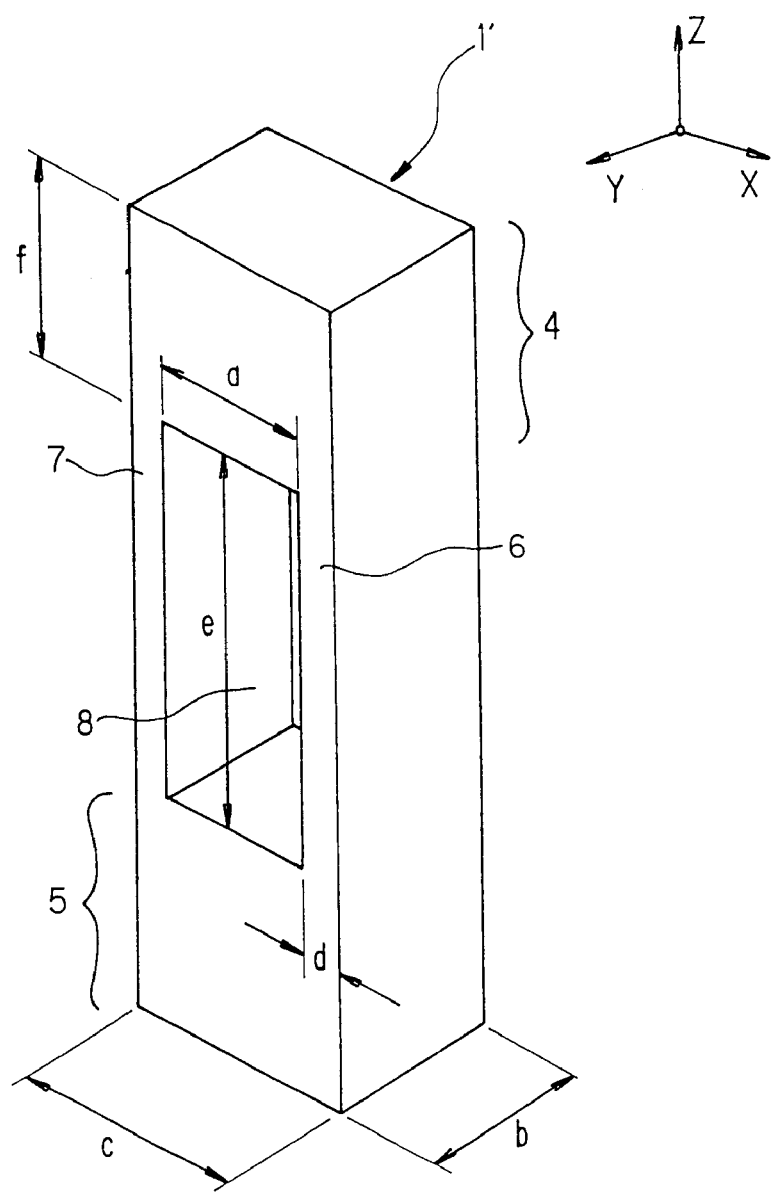
FIG. 4 shows a schematic perspective view depicting a structure of a base for a piezoelectric/electrostrictive device of the present invention.

FIG. 4 is a schematic perspective view for describing the composition of respective members of the base 1' to be used in a device of the present invention. The device comprises respective members composed of thin plate portions 6 and 7 having piezoelectric/electrostrictive elements (not shown) formed thereon and constituting a driving portion (not shown) to be driven by displacement thereof, a movable portion 4 to be displaced in accordance with a drive of the driving portion (not shown), and a fixing portion 5 for holding the driving portion to be formed by the thin plate portions 6 and 7 and a piezoelectric/electrostrictive element and the movable portion 4. The fixing portion 5 and the movable portion 4 are coupled via the thin plate portions 6 and 7, and a hole 8 is formed by inner walls of the thin plate portions 6 and 7, inner wall of the movable portion 4, and an inner wall of the fixing portion 5.

2. Composing Members of Base

Respective members of a base composing a device of the present invention are individually and specifically described by way of a base 1' shown in FIG. 4.

(1) Movable Portion and Fixing Portion

A movable portion 4 is a portion to be operated based on the driving quantity of a driving portion 3 (not shown, details thereof to be described later), and a variety of members are mounted thereon depending on the application of the device. For example, when the device is used as a displacement element, a shield of an optical shutter is mounted thereon, and when the device is used as a positioning mechanism or ringing suppression mechanism for a hard disk drive, members requiring positioning such as a magnetic head, a slider with a magnetic head mounted thereon, a suspension with a slider mounted thereon, or the like are mount on the movable portion.

A fixing portion 5 is a portion for holding a driving portion 3 and a movable portion 4, and a device 1 as a whole is secured by securely holding the fixing portion 5 to any base such as, for example, a carriage arm fixed to a VCM (voice coil motor), or a fixing plate attached to the carriage arm, or the tip of the suspension, or the like, when utilizing the device as the positioning mechanism for the hard disk drive.

Further, an electrode lead or other members for controlling a piezoelectric/electrostrictive element 2 may also be arranged.

As materials for composing the movable portion 4 and the fixing portion 5, although no specific limitation is there as long as rigidity is there, ceramics which can be applied for the ceramic green sheet laminating method to be described later can be preferably used. More specifically, in addition to zirconia such as fully-stabilized zirconia, partially-stabilized zirconia, or the like, or materials containing alumina, magnesia, silicon nitride, aluminum nitride, or titanium oxide as the major component, materials containing a mixture of those listed may be used. However, in view of the higher mechanical strength and toughness, preferable are materials containing zirconia, more particularly fully-stabilized zirconia as the major component, or materials containing partially-stabilized zirconia as the major component.

(2) Driving Portion

A driving portion 3 is a portion to be driven by displacement of a piezoelectric/electrostrictive element 2, and comprises mutually opposing thin plate portions 6 and 7, and a predetermined number, for example, two for the first aspect, three for the second aspect, and four for the third aspect, of the film-like piezoelectric/electrostrictive elements 2 formed on surfaces of the thin plate portions 6 and 7.

① Thin Plate Portion

Thin plate portions 6 and 7 are flexible thin plate-like members, and have functions to convert and amplify expanding and/or contracting strain of a piezoelectric/electrostrictive element 2 disposed on the surface thereof into bending displacement for transmitting to a movable portion 4.

Accordingly, forms and materials of the thin plate portions 6 and 7 suffice with those having flexibility and the mechanical strength in the order of not being broken by flexural deformation, and can be suitably selected considering responsibility and operability of the movable portion.

Ordinarily, the thickness of the thin plate portion 6 or 7 is preferably around 2 to 100 $\mu$m, and the total thickness of the thin plate portion 6 or 7 and a piezoelectric/electrostrictive element 2 combined together is preferably 7 to 500 $\mu$m. The width of the thin plate portions 6 and 7 are preferably 50 to 2000 $\mu$m. This point is further described later.

As materials composing the thin plate portions 6 and 7, ceramics similar to the movable portion 4 and the fixing portion 5 can be preferably used, and zirconia, more particularly a material containing fully-stabilized zirconia as the major component and a material containing partially-stabilized zirconia as the major component, is most preferably employed since it has larger mechanical strength (even after machined into a thin-walled structure), higher toughness, and smaller reactivity relative to a piezoelectric/electrostrictive film or an electrode material. In the meantime, with regard to the fully-stabilized and partially-stabilized zirconia, those stabilized in the following manner are preferable. Namely, compounds that can stabilize zirconia are yttrium oxide, ytterbium oxide, cerium oxide, calcium oxide, and magnesium oxide, and by adding and including at least one of these compounds, zirconia is partially or fully stabilized, and stabilization of zirconia is also possible not only by adding one kind of the compounds but also by adding a combination of the compounds.

Meanwhile, as to adding quantity of respective compounds, it is 1 to 30 mol % (mole percent) and preferably 1.5 to 10 mol % in case of yttrium oxide or ytterbium oxide, 6 to 50 mol % and preferably 8 to 20 mol % in case of cerium oxide, and 5 to 40 mol % and preferably 5 to 20 mol % in case of calcium oxide or magnesium oxide. Among these listed, particularly use of yttrium oxide as the stabilizer is preferable, and in this case, 1.5 to 10 mol % is preferable, and 2 to 4 mol % is more preferable. Further, as an additive for a sintering aid, alumina, silica, magnesia, an oxide of transition metal, or the like may preferably be added in a range of 0.05 to 20 weight percent. However, it is preferred to add alumina, magnesia, an oxide of transition metal, or the like as an additive when an integration method by sintering a green element formed by the film forming method is employed as a means for forming a piezoelectric/electrostrictive element.

It should be noted that, in order to obtain the desired mechanical strength and the stable crystal phase, the average crystal grain size of zirconia may desirably be 0.05 to 3 $\mu$m, and more desirably 0.05 to 1 $\mu$m. Further, although ceramics similar to the movable portion 4 and the fixing portion 5 may be used for the thin plate portions 6 and 7, as described previously, preferably desirable is that the thin plate portions 6 and 7 are composed of substantially the same materials in view of the higher reliability of joined portions, increased mechanical strength of the device, and lowered complication in fabrication.

Base 1' is structured so that a ratio a/b of the thickness of the hole 8, namely a distance a in the X-axis direction in FIG. 4 and the width of the thin plate 6 or 7, namely a distance b in the Y-axis direction in FIG. 4 is 0.5 to 20. The ratio a/b is preferably set at 1 to 10, and more preferably at 2 to 8. The defined value of the a/b is prescribed based on knowledge that a displacement of a piezoelectric/electrostrictive device according to the present invention can be made larger and a displacement in the X-Z plane in FIG. 4 can be dominantly obtained. On the other hand, a ratio e/a of the length of the thin plate portion, namely a distance e in the Z-axis direction in FIG. 4 and the thickness a of the above-described hole is preferably set at 0.5 to 10, and more preferably at 0.7 to 5. The defined value of the e/a is based on knowledge that the piezoelectric/electrostrictive device according to the present application can generate a larger displacement in higher resonant frequency, namely at a higher speed of response. Accordingly, it is specifically preferable to have the ratio a/b of 0.5 to 20, and the ratio e/a of 0.5 to 10; and extremely preferable to have the ratio a/b of 1 to 10, and the ratio e/a of 0.7 to 5, so as to make the present device have such a structure that not only flapped displacement or vibration in the Y-axis direction can be suppressed, but also a larger displacement at relatively low voltage can be attained with keeping superiority in high speed responsibility.

The length f of the movable portion 4 shown in FIG. 4 is preferably shorter. By making the length shorter, the weight of the movable portion can be made lighter and the resonant frequency can be increased. However, in order to secure the rigidity of the movable portion 4 in the X-axis direction, and to ensure a displacement thereof, the ratio f/d with the thickness d of the thin plate portion is made 3 or more, and preferably 10 or more. In addition, actual dimensions of respective members are to be determined also considering such factors as a bonding area for mounting the members on the movable portion 4, a bonding area for mounting the fixing portion 5 to another member, a bonding area for mounting the terminals or the like for electrodes, mechanical strength, durability, required displacement, and resonant frequency of the device as a whole, a driving voltage, and the like. Ordinarily, a is preferably 100 to 2000 $\mu$m, and more preferably 200 to 1000 $\mu$m. Ordinarily, b is preferably 50 to 2000 μm, and more preferably 100 to 500 μm. Ordinarily, d is made to be b>d relative to the width b of the thin plate portions 6 and 7, and is preferably 2 to 100 μm, and more preferably 4 to 60 μm. Ordinarily, e is preferably 200 to 3000 μm, and more preferably 300 to 2000 μm. And, ordinarily, f is preferably 50 to 2000 μm, and more preferably 100 to 1000 μm.

It should be noted that by structuring in such a manner, the displacement in the Y-axis direction ordinarily does not exceed 10% relative to the displacement in the X-axis, that is the major axis, direction. However, by suitably adjusting within a range of the previously described preferable dimension ratios and the actual dimensions, driving at a low voltage can be made possible, and a displacement component in the Y-axis can be adjusted to 5% or less, which is an extremely superior advantage. In other words, a substantially dominant displacement is obtained only in the X-axis, namely the major axis. Further, in addition to the characteristics described previously, obtained is a device which can develop a large displacement, superior in high speed responsibility, at a relatively low voltage.

Further, positional relations of respective members in a driving state of a device according to the present invention are described with reference to FIG. 3(*b*). In FIG. 3(*b*), the device according to the present invention is so structured that, by driving two each, four in total, piezoelectric/electrostrictive elements 2 disposed mutually opposed respectively on thin plate portions 6 and 7, by way of functions of respective elements, the thin plate portion 6 is, by operation of one pair of piezoelectric/electrostrictive elements formed mutually opposed on the same thin plate portion 6, curved toward the hole 8, on the side of the fixing portion 5, and toward the opposite side of the hole 8, on the side of the movable portion 4, and the thin plate portion 7 is, by operation of one pair of piezoelectric/electrostrictive elements formed mutually opposed on the same thin plate portion 7, curved toward the opposite side of the hole 8, on the side of the fixing portion 5, and toward the hole 8, on the side of the movable portion 4, thus a large displacement quantity as shown in FIG. 3(*b*) can be obtained. Naturally, by suitably selecting functions of the four elements, a desired displacement can be obtained. By this structure, an inner wall of the movable portion 4 and an inner wall of the fixing portion 5 can be maintained in parallel, thus the displacement is efficiently increased. In other words, by eliminating rotation of the movable portion 4, efficiency is increased.

② Piezoelectric/Electrostrictive Element

A piezoelectric/electrostrictive element 2 has at least a part thereof formed on thin plate portions 6 and 7, and constitutes a driving portion 3 together with the thin plate portions 6 and 7, and, for example, as shown in FIG. 3, comprises a pair of electrodes 2*b* and 2*c* for applying a voltage to a piezoelectric/electrostrictive film and a piezoelectric/electrostrictive film 2*a*. In a device according to the present invention, although a conventionally known piezoelectric/electrostrictive element such as a unimorphtype, a bimorph-type, or the like may be used, it is preferable to compose the device described in the present application with the unimorph-type piezoelectric/electrostrictive element, as the unimorph-type element is superior in stability of displacement quantity to be generated, and advantageous in reducing weight. For example, preferably can be used are a laminated type piezoelectric/electrostrictive element 2 or the like, with a first electrode 2*c*, a piezoelectric/electrostrictive film 2*a*, and a second electrode 2*b* laminated thereon, as shown in FIG. 8.

Figure 8:
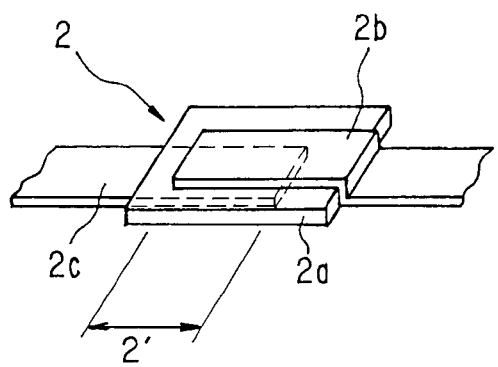
FIG. 8 shows a schematic perspective view depicting an embodiment of one of piezoelectric/electrostrictive elements constituting a piezoelectric/electrostrictive device of the present invention.

Generally, the piezoelectric/electrostrictive element described in FIG. 8 has such a function that in a case that a piezoelectric material such as a ferroelectric substance or the like is used for a piezoelectric/electrostrictive film thereof, a voltage is applied across the above-described electrodes (for example, between a second electrode 2*b* and a first electrode 2*c*), and when an electric field is exerted to the piezoelectric/electrostrictive film 2*a*, based on the electric field, an electric field induced strain is induced on the piezoelectric/electrostrictive film 2*a*, and as a transverse effect thereof, a strain in the contracting mode in a direction parallel to the main surface of the piezoelectric/electrostrictive film is primarily generated. Accordingly, if a piezoelectric/electrostrictive element of this structure is applied to the device of the present invention, the strain which contracts in the direction of the above-described main surface is converted into a bending displacement which bends the thin plate portion, and the driving portion is bent for a displacement in a direction toward the outer space (in the opposite direction of the hole) by use of the joined portion of the thin plate portion with the movable portion or the thin plate portion with the fixing portion as the fulcrums, thus the movable portion can be displaced in a predetermined direction.

It should be noted that when an antiferroelectric substance is used instead of the ferroelectric material as the above-described piezoelectric material, on account of a difference in strain generating mechanism of piezoelectric/electrostrictive materials, in other words, when an electric field is applied to a piezoelectric/electrostrictive film, the piezoelectric/electrostrictive film functions to generate a strain caused by volume expansion of a crystal which is based on the phase transition from antiferroelectric phase to ferroelectric phase, namely a strain of expansion mode primarily in a direction of the main surface of the piezoelectric/electrostrictive film. Accordingly, in this case, in opposition to the piezoelectric/electrostrictive element in which the ferroelectric substance is used, the driving portion is bent and displaced in a direction toward the inner space (in a direction of the hole), and as the result, the movable portion can be displaced in a direction opposite to the case where the ferroelectric substance is used. In this way, while the structure is the same, different functions may be had by applying piezoelectric/electrostrictive materials having a different strain generating mechanism.

Further, it is also preferable, in addition to a structure having the piezoelectric/electrostrictive film 2*a* interposed by a pair of upper and lower electrodes, to form a piezoelectric/electrostrictive film 2*a* further on the second electrode, and to form a third electrode further on the piezoelectric/electrostrictive film 2*a* to make a piezoelectric/electrostrictive element having a structure of at least two or more stairs. Furthermore, it is also preferable to have a structure formed by repeating an electrode and a piezoelectric/electrostrictive film in three stairs, four stairs, five stairs, or ever more. By having piezoelectric/electrostrictive elements in multiple stair structures in this manner, the driving force of the driving portion is increased, and larger displacement is made obtainable. Also, in a structure having the higher rigidity of the device per se, for example, in a structure or the like where the thin plate is made thicker, a larger displacement and higher resonant frequency can be made easily compatible. A device using piezoelectric/electrostrictive elements in a multiple stair structure is separately described later.

Figure 9:
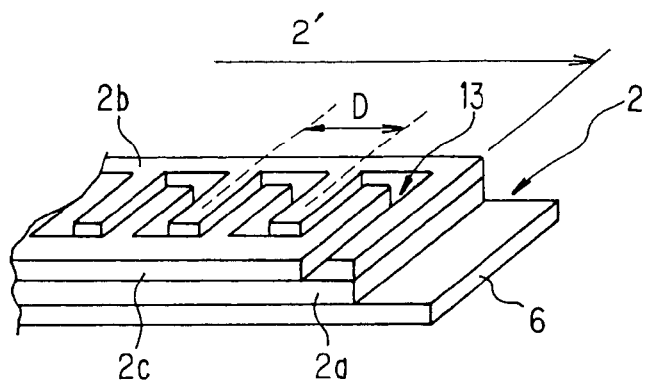
FIG. 9 shows a schematic perspective view depicting an embodiment of one of piezoelectric/electrostrictive elements constituting a piezoelectric/electrostrictive device of the present invention.

Further, also usable is a piezoelectric/electrostrictive element 2 having a structure comprising a first electrode 2*b* and a second electrode 2c in a comb-shape structure, as shown in FIG. 9, wherein the first electrode 2b and the second electrode 2c are structured to be mutually opposed and interleaved with a gap 13 of predetermined width between teeth of mutual combs. In FIG. 9, while the first electrode 2b and the second electrode 2c are arranged on the upper surface of the piezoelectric/electrostrictive film 2a, the electrode may be formed between the thin plate portion 6 and the piezoelectric film 2a, or the electrodes may also be formed preferably on the upper surface of the piezoelectric/electrostrictive film 2a and between both surfaces of the thin plate portion 6 and the piezoelectric/electrostrictive film 2a. In other words, in a piezoelectric/electrostrictive element of the present structure, electrodes are formed on at least one main surface of at least the piezoelectric/electrostrictive film 2a. Further, a piezoelectric/electrostrictive element 2 shown in FIG. 10 also comprises a first electrode 2b and a second electrode 2c of the comb-shaped structure, and the first electrode 2b and the second electrode 2c are structured to be mutually opposed and interleaved with a gap 13 of predetermined width between teeth of mutual combs. The piezoelectric/electrostrictive element 2 is structured to have the piezoelectric/electrostrictive film 2a so as to be embedded in the gap 13 between the first electrode 2b and the second electrode 2c, however, such piezoelectric/electrostrictive element can also be preferably used in the device of the present invention.

Figure 10:
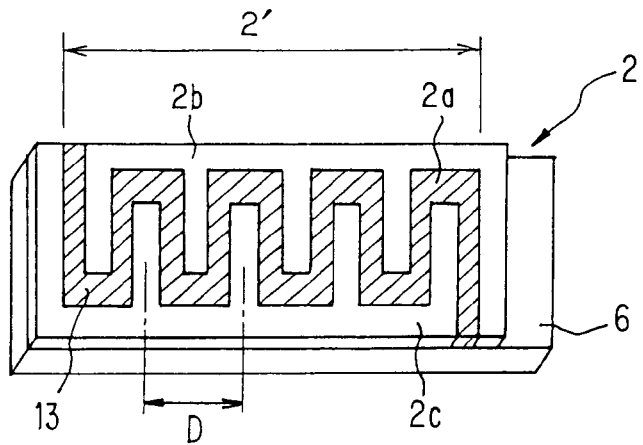
FIG. 10 shows a schematic perspective view depicting an embodiment of one of piezoelectric/electrostrictive elements constituting a piezoelectric/electrostrictive device of the present invention.

The piezoelectric/electrostrictive element described in FIG. 9 and FIG. 10 has functions different from the piezoelectric/electrostrictive element shown in FIG. 8. The piezoelectric/electrostrictive element of the structure shown in FIGS. 9 and 10 has such a function that the electric field-induced strain is induced on the piezoelectric/electrostrictive film 2a based on an electric field, thereby a strain of the mode expanding in a direction parallel to the main face of the piezoelectric/electrostrictive film is generated as a longitudinal effect thereof, when a voltage is applied across the comb-teeth-shaped electrodes, and the electric field acts on the piezoelectric/electrostrictive film 2a.

Accordingly, if the piezoelectric/electrostrictive element of this structure is applied to the device of the present invention, the strain expanding in the direction of the main surface described above is converted into a bending displacement which bends the thin plate portion, and the driving portion is bent for displacement in a direction toward the inner space (in the direction of the hole) by use of the joined portion of the thin plate portion with the movable portion or the thin plate portion with the fixing portion as fulcrum, and as the result the movable portion can be displaced in a predetermined direction. In the meantime, ordinarily an element having a comb-teeth-shaped electrode structure according to FIG. 9 and FIG. 10 is arranged such that a pitch direction of the comb teeth is oriented to a direction of the thin plate portion from the fixing portion toward the movable portion. By arranging in this manner, the expansion strain based on the longitudinal effect of the electric field induced strain can be effectively utilized as the bending displacement. In this way, the structure of FIG. 8 and the structures of FIG. 9 and FIG. 10 are different in the directions of strain of the piezoelectric/electrostrictive operating portions in the direction of the main surface of the thin plate portion as the ground, and come to have mutually different functions in the point.

When piezoelectric/electrostrictive elements having comb-shaped electrodes such as piezoelectric/electrostrictive elements as shown in FIG. 9 and FIG. 10 are used, the displacement of the piezoelectric/electrostrictive element can be made larger by reducing the pitch D of the teeth of the combs.

Further, for example, in a third aspect of the device according to the present invention, as shown in FIGS. 3(a) and (b), whereas, on respective thin plate portions 6 and 7, a piezoelectric/electrostrictive element 2 having at least one end thereof being arranged on a part of a fixing portion 5 comprising a pair of electrodes 2b and 2c, and a piezoelectric/electrostrictive film 2a, and a piezoelectric/electrostrictive element 2 having at least one end thereof being arranged on a part of the movable portion 4 comprising a pair of electrodes 2b and 2c, and a piezoelectric film 2a, are respectively provided on the thin plate portions 6 and 7, respectively opposing one each, and four in total, two piezoelectric/electrostrictive elements 2 provided mutually opposed on the outer surfaces of the same thin plate portion 6 or 7 may share either one of at least a second electrode 2b or a first electrode 2c. Further, two piezoelectric/electrostrictive elements 2 provided mutually opposed on the outer surface of the same thin plate portion 6 or 7 may share only the piezoelectric/electrostrictive film 2a. On the other hand, two piezoelectric/electrostrictive elements provided mutually opposed on an outer surface of the same thin plate portion out of a pair of mutually opposing thin plate portions may have an element having the same or mutually different functions arranged thereon.

An example of arranging elements having mutually different functions as two piezoelectric/electrostrictive elements provided mutually opposed on the outer surfaces of the same thin plate portions is an aspect wherein either one of the piezoelectric/electrostrictive elements is made of a type to utilize the longitudinal effect of the electric field induced strain and the other of the piezoelectric/electrostrictive elements is made of another type to utilize the transverse effect of the electric field induced strain. More specifically, one of the elements may be structured as a piezoelectric/electrostrictive element having the structure as shown in FIG. 9 or FIG. 10, and the other of the elements may be structured as a piezoelectric/electrostrictive element having the structure as shown in FIG. 8. Further, for example, as respective two piezoelectric/electrostrictive elements existing mutually in the diagonal directions across a hole out of four piezoelectric/electrostrictive elements provided on the outer surfaces of a pair of mutually opposing thin plate portions, elements respectively having the same function, for example, a type utilizing the longitudinal effect of the electric field induced strain, may be arranged. At this time, by arranging elements having mutually different functions as two piezoelectric/electrostrictive elements provided mutually opposed on the outer surface of the same thin plate portion, all the four piezoelectric/electrostrictive elements can be made simultaneously driven, and a remarkably large displacement is obtained.

Furthermore, when two piezoelectric/electrostrictive elements exist mutually in the diagonal directions relative to the center of the hole out of four piezoelectric/electrostrictive elements provided on the outer surfaces of a pair of mutually opposing thin plate portions, elements having mutually different functions, for example, a type to utilize the longitudinal effect of the electric field induced strain and another type to utilize the transverse effect of the electric field induced strain, may be respectively arranged. In this case, two piezoelectric/electrostrictive elements provided mutually opposed on an outer surface of the same thin plate portion out of a pair of mutually opposing thin plate portions may have an element having the same or mutually different functions arranged thereon.

As specific ceramics for forming a piezoelectric/electrostrictive film, ceramics containing, individually or as a mixture, lead zirconate, lead titanate, lead magnesium niobate, lead nickel niobate, lead zinc niobate, lead manganese niobate, lead antimony stannate, lead manganese tungstate, lead cobalt niobate, barium titanate, sodium bismuth titanate, potassium sodium niobate, strontium bismuth tantalate, or the like may be listed. More specifically, in view of providing materials having a high electromechanical coupling factor and piezoelectric constant, smaller reactivity with the thin plate portion (ceramics) at the time of sintering the piezoelectric/electrostrictive film, and stable composition, the material whose major component is a mixture of lead zirconate, lead titanate, and lead magnesium niobate, or materials containing sodium bismuth titanate as the major component may be preferably used. Additionally, it is possible to add a glass component to the major component described previously, however, it is not preferable in view of securing larger displacement. The reason being that the reaction of the glass with the above-described major components makes it impossible to obtain a feature intrinsic to the piezoelectric/electrostrictive materials.

Further, one may use, as the above-described ceramics for the piezoelectric/electrostrictive film, the ceramics obtainable by adding thereto, singularly or as a mixture, oxides of lanthanum, calcium, strontium, molybdenum, tungsten, barium, niobium, zinc, nickel, manganese, cerium, cadmium, chromium, cobalt, antimony, iron, yttrium, tantalum, lithium, bismuth, tin, and the like. For example, by having a mixture of lead zirconate and lead titanate and lead magnesium niobate, being the major components, contained with lanthanum or strontium, there may an occasion when an advantage is obtained that the coercive electric field or the piezoelectric feature may be made adjustable. Other minor additives may be added as required.

On the other hand, an electrode of a piezoelectric/electrostrictive element is solid at room temperature, and is preferably composed of a metal superior in conductivity, for example, such as aluminum, titanium, chromium, iron, cobalt, nickel, copper, zinc, niobium, molybdenum, ruthenium, palladium, rhodium, silver, tin, tantalum, tungsten, iridium, platinum, gold, lead, or the like, is used singularly or as an alloy, and further, a cermet material made by dispersing the same materials as used for the piezoelectric/electrostrictive films and/or the thin plate portions may be used in those materials listed above.

Selection of materials for an electrode in a piezoelectric/electrostrictive element is determined in accordance with a sequence, a method, or the like in forming the electrode and the piezoelectric/electrostrictive film. For example, when a piezoelectric/electrostrictive film is formed on a first electrode by sintering after the first electrode is formed on a thin plate portion, it is necessary to use a metal of high melting point such as platinum or the like for the first electrode which is not subjected to change at the sintering temperature of the piezoelectric/electrostrictive film, and when a second electrode is formed on a piezoelectric/electrostrictive film after the piezoelectric/electrostrictive film is formed, the electrode can be formed at a low temperature, thus a metal of low melting point such as aluminum, gold, silver, or the like may be used.

As the thickness of an electrode may also decrease a displacement of the piezoelectric/electrostrictive element, specifically the second electrode described in FIG. 8 to be formed after sintering the piezoelectric/electrostrictive film, the comb-shaped electrode described in FIG. 9, or the like, it is preferable to use organic metal paste, thereby a finer and thinner film is obtainable after firing. For example, materials such as gold resinate paste, platinum resinate paste, silver resinate paste, or the like can be used.

Figure 5:
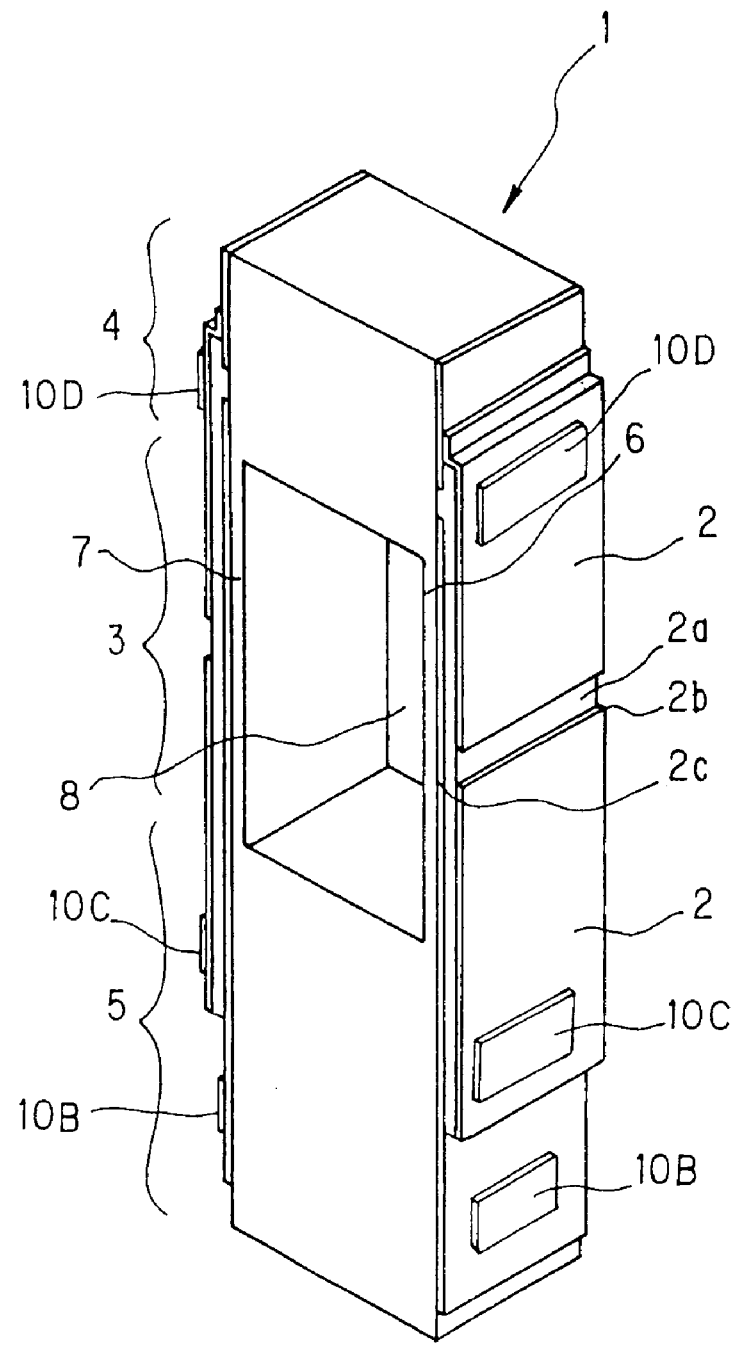
FIG. 5 shows a schematic perspective view depicting an embodiment of a piezoelectric/electrostrictive device of the present invention.

Specific configuration of respective members of a device according to the present invention, namely structure of a piezoelectric/electrostrictive element, arrangement of a terminal to apply a driving signal, drawing-out of an electrode lead from the piezoelectric/electrostrictive element, or the like is described with reference to the accompanying drawings. FIG. 5 shows a schematic perspective view illustrating a device 1 according to the above-described third aspect of the present invention. The device 1 comprises, as a fundamental structure, respective members of a driving portion 3 to be driven by the displacement of a piezoelectric/electrostrictive element 2, a movable portion 4 to be operated based on the drive of the driving portion 3, and a fixing portion 5 for holding the driving portion 3 and the movable portion 4. The fixing portion 5 and the movable portion 4 are coupled together via the driving portion 3, and a hole 8 is formed by inner walls of the driving portion 3, movable portion 4, and fixing portion 5. The driving portion 3 is a pair of mutually opposing thin plate portions, and on both outer surfaces of the thin plate portions, piezoelectric/electrostrictive elements 2 of the structure of FIG. 8 composed by four of a pair of electrodes and a piezoelectric film, respective one ends thereof being arranged on parts of the fixing portion 5 or the movable portion 4. By employing such structure, the mechanical strength of joined portions of the thin plate portions with the movable portion, and the thin plate portion with the fixing portion is raised, and operation at a high speed is made possible, as well as displacement quantity of the movable portion can be increased by employing suitable methods for driving in accordance with a desired operating aspect. In the aspect shown in FIG. 5, between one pair of the piezoelectric/electrostrictive element 2 formed mutually opposed respectively on the outer surface of the same thin plate portion, a first electrode 2c and a piezoelectric/electrostrictive film 2a are shared. And for the first electrode 2c, shared and made for common use, electrode leads are drawn out at, and a terminal 10B is arranged on, the vicinity of ends of the fixing portion 5 on the faces where respective piezoelectric/electrostrictive elements 2 are formed. As for the second electrode 2b, electrode leads are respectively drawn out to, and terminals 10C, 10D are respectively arranged on, the side of the fixing portion 5 and the side of the movable portion 4 on the faces where respective piezoelectric/electrostrictive elements 2 are formed. Such aspect has no electrode formed at a portion of the fixing portion 5 side of the face where the hole 8 is apertured, and according to this structure, the device can be fixed independently of the face where terminals are arranged. As a result, high reliability can be obtained in securing the device and bonding of a circuit with the terminals. By the way, in this aspect, a terminal and a circuit are joined together by a flexible print circuit (also called FPC), a flexible flat cable (also called FFC), a wire bonding, or the like.

Elements are driven through terminals 10B, 10C, and 10D, and a voltage is applied across respective sets of the terminals 10B and 10C, and 10B and 10D. In the device in FIG. 5, the piezoelectric/electrostatic elements 2 existing in mutually diagonal directions across the hole 8 are driven simultaneously, but not simultaneously with the piezoelectric/electrostrictive elements 2 existing mutually opposed on the same the same thin plate portion. For example, when a voltage is applied across respective terminals of the piezoelectric/electrostrictive element 2 of the fixing portion side on the thin plate portion 6 and of the piezoelectric/electrostrictive element 2 of the movable portion side on the thin plate portion 7 in diagonal directions thereof, an electric field is exerted on respective piezoelectric/electrostrictive films, and the electric field induced strain is induced on respective piezoelectric/electrostrictive films by the electric field, strain due to the transverse effect thereof is converted into bending displacement of the thin plate portions, and the movable portion is displaced toward the right-hand side in FIG. 5. Displacement shape at this time of both the thin plate portions is characterized in that the shape thereof is mutually rotationally symmetric, the movable portion displaces in great magnitude, and operation is at high speed. When the movable portion is made to displace toward the left-hand side in FIG. 5, another set of elements in diagonal directions different from the above-described set may be driven in the same manner.

Figure 6:
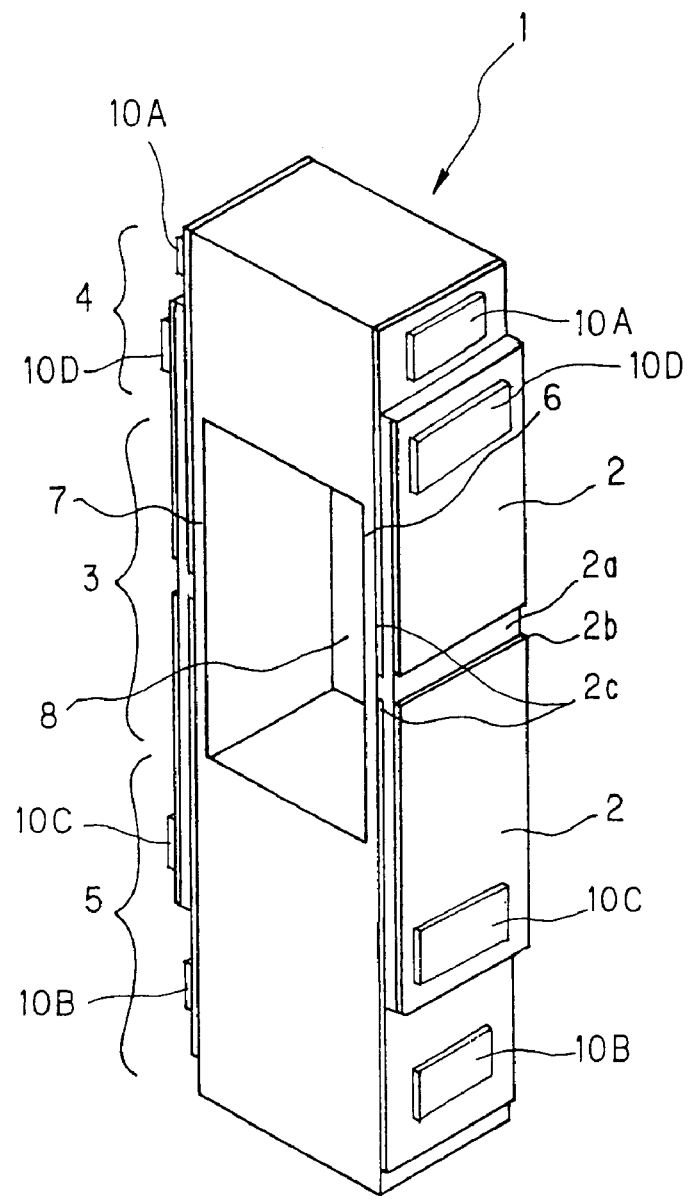
FIG. 6 shows a schematic perspective view depicting another embodiment of a piezoelectric/electrostrictive device of the present invention.

On the other hand, a device shown in FIG. 6 is a modification of the device shown in FIG. 5, and is different therefrom in the point that a first electrode is not shared among a pair of the piezoelectric/electrostrictive elements formed mutually opposed on the outer surface of the same thin plate portion.

Figure 7:
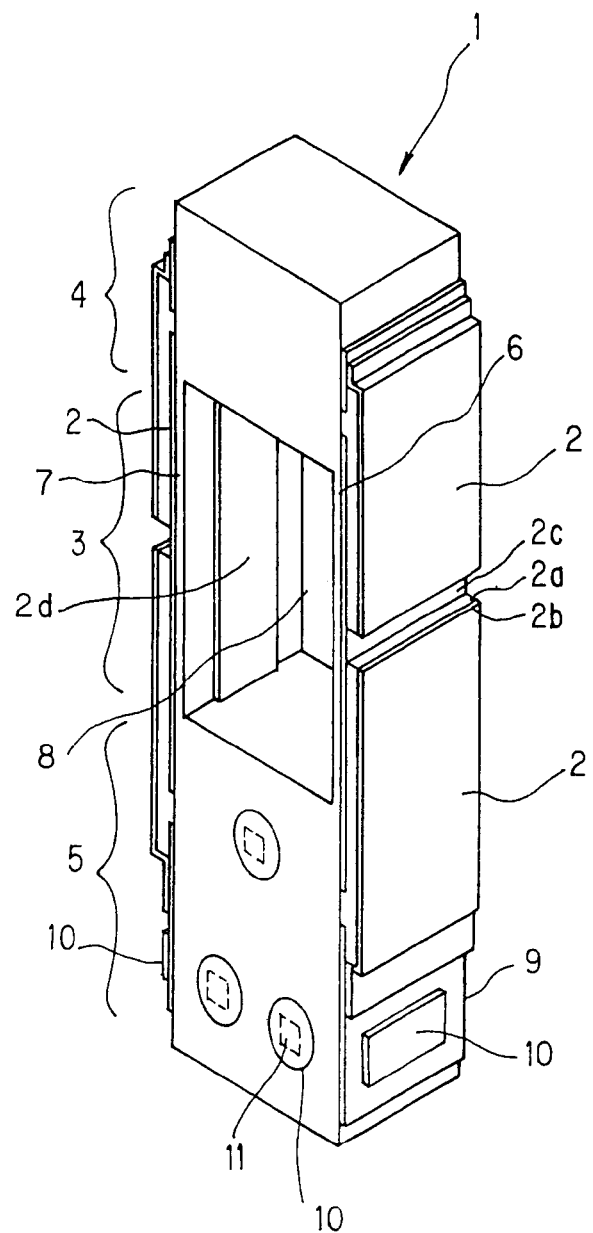
FIG. 7 shows a schematic perspective view depicting still another embodiment of a piezoelectric/electrostrictive device of the present invention.

Further, as shown in FIG. 7, three through-holes (11) provided on a fixing portion 5 may be utilized. In this case, the through-holes (11) are provided in advance on the fixing portion 5, and after the through-holes are filled with conductive materials, a piezoelectric/electrostrictive element pattern is formed so as to have respective electrodes joined with the through-holes (11), then the filled surfaces of the through-holes are exposed by machining, and terminals 10 to apply driving signals are formed thereon. A conducting wire may be embedded as a conductive material. It should be noted that, in this example, a through-hole provided in the vicinity of the hole 8 out of the three through-holes is used as a common terminal. Meanwhile, the device shown in FIG. 7 is an example of the device belonging to the third aspect of the present invention.

In FIG. 7, electrode leads 2d are respectively formed on the inner walls of a pair of thin plate portions 6 and 7, which is one of the factors defining the hole 8. The two electrode leads 2d are connected with respective through-holes 11 formed on the lower part of the fixing portion 5 out of the above-described three through-holes. Second electrodes 2b respectively provided in two piezoelectric/electrostrictive elements 2 having one end portion on the movable portion 4 on respectively provided mutually opposed on the outer surfaces of a pair of thin plate portions 6 and 7 are respectively made conductive with the above-described electrode leads 2d via the through-holes in the movable portion 4. Thus, the second electrodes 2b in the piezoelectric/electrostrictive elements 2 having one end portion on the movable portion 4 are connected with respective through-holes 11 formed at the lower part of the fixing portion 5 via the electrode lead 2d. Meanwhile, first electrode 2c in the two piezoelectric/electrostrictive elements respectively provided mutually opposed on the outer surfaces of a pair of thin plate portions 6 and 7 are respectively made to be commonly used, and use a terminal provided on the through-hole 11 provided in the vicinity of the hole 8 out of the three through-holes as a common terminal. In this aspect, a face of the fixing portion 5 where the through-holes are not formed, namely, a back side face 9 in FIG. 7, can be used for securing elements.

Although not shown, for example, in the device shown in FIG. 5, a terminal may be arranged on the main surface, namely on one of the faces where the hole 8 is apertured. In other words, aspects for electrode lead drawing out or aspects for terminal arrangement are not specifically limited to the above-described aspects, and it is important to determine them in accordance with a variety of conditions such as use application of a device, method of fabricating thereof, function of a piezoelectric/electrostrictive element, method of driving, and the like.

Figure 15:
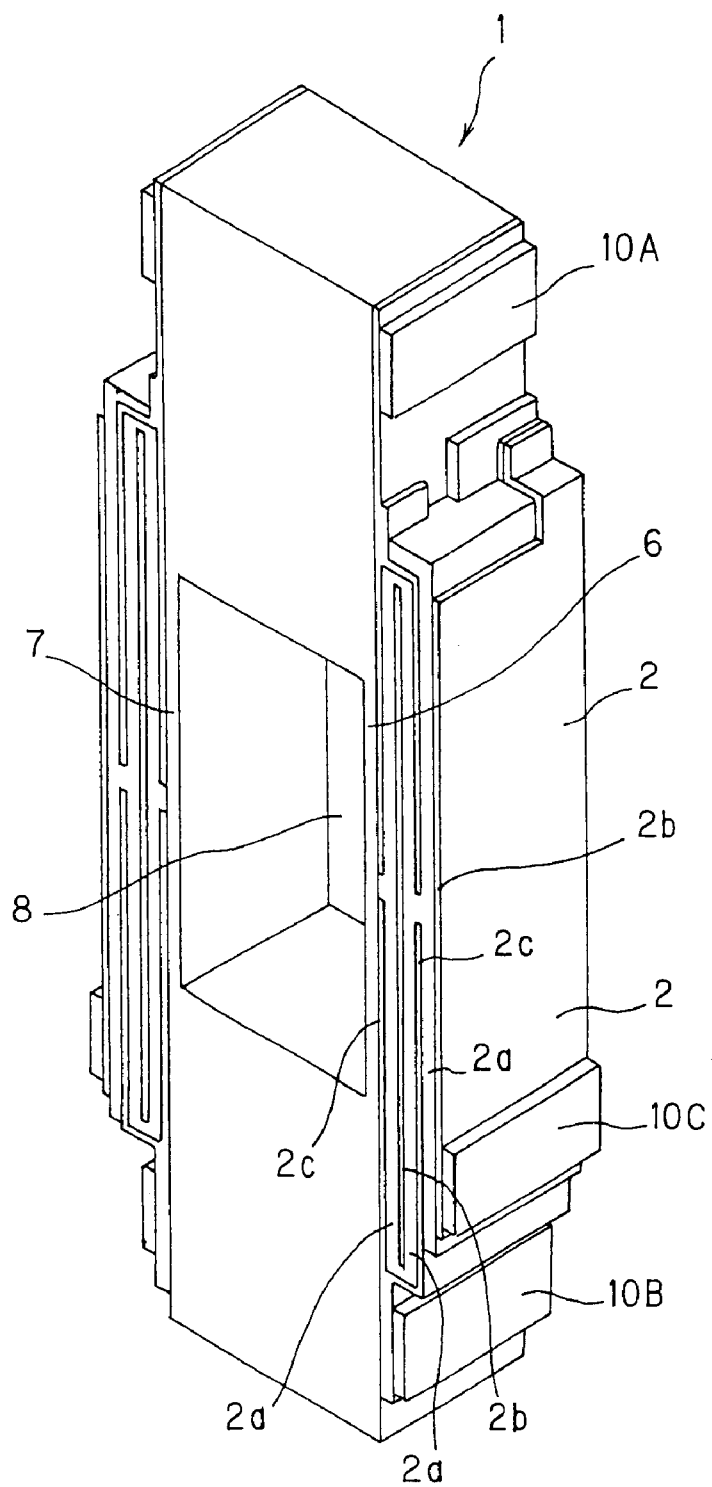
FIG. 15 is a schematic perspective view depicting another embodiment of a piezoelectric/electrostrictive device of the present invention.

For example, a device described in FIG. 15 has, in the structure according to the third aspect of the present invention, piezoelectric/electrostrictive elements in three stairs. More in detail, respective piezoelectric/electrostrictive elements 2, basing on the structure described in FIG. 8, are formed by sequentially laminating a first electrode 2c, a piezoelectric/electrostrictive film 2a, a second electrode 2b, a piezoelectric/electrostrictive film 2a, a first electrode 2c, a piezoelectric/electrostrictive film. 2a, and a second electrode 2b, and members comprising a pair of electrodes and a piezoelectric/electrostrictive film are laminated in three stairs in a direction in which composing films of the elements are formed in layers. Further, a piezoelectric/electrostrictive film is shared among respective piezoelectric/electrostrictive elements arranged mutually opposed on the same thin plate portion, and in addition, a second electrode is also shared among the above-described elements. The elements are driven by conducting electric signals to be transmitted to terminals 10A, 10B, and 10C. The terminal 10A is connected with the electrode 2c of the piezoelectric/electrostrictive element 2 formed on the movable portion side of the thin plate portion 6, the terminal 10B is connected with the electrode 2c of the piezoelectric/electrostrictive element 2 formed on the fixing portion side on the thin plate portion 6, and the terminal 10C is connected with the electrode 2b of both the piezoelectric/electrostrictive elements 2 on the thin plate portion 6, respectively, and a voltage is applied respectively to sets of the terminals 10A and 10C, and 10B and 10C. The structure of and the relations with the terminals of these respective piezoelectric/electrostrictive elements are the same also for the respective piezoelectric/electrostrictive elements of the thin plate portion 7. Further, respective electrodes denoted by the same symbol in the same element are to be applied with a voltage of the same potential.

Such a device as shown in FIG. 15 is driven such that, for example, two piezoelectric/electrostrictive elements 2 mutually existing in diagonal direction across the hole 8 are simultaneously driven, while respective piezoelectric/electrostrictive elements 2 existing mutually opposed on the same thin plate portion are not simultaneously driven. In other words, when a voltage is applied to respective terminals of the piezoelectric/electrostrictive elements 2 of the fixed portion side on the thin plate portion 6 and the piezoelectric/electrostrictive elements 2 of the movable portion side on the thin plate portion 7 in the diagonal directions thereof, an electric field is exerted to respective piezoelectric/electrostrictive films, the electric field induced strain is induced on respective piezoelectric/electrostrictive films by the electric field, strain due to the transverse effect thereof is converted into a bending displacement of the thin plate portions, thus the movable portion is displaced toward the right-hand side in FIG. 15. At this time, the displacement shape of both the thin plate portions is characterized in that a shape is mutually rotationally symmetric, the movable portion has a very large displacement because of large driving force due to piezoelectric operating portions which are made in three stairs (three layers), and operation is performed in a high speed. When the movable portion is made to displace toward the left-hand side in FIG. 15, ordinarily, the elements related with another combination of the diagonal directions different from the above-described combination may be driven in the similar manner.

Figure 16:
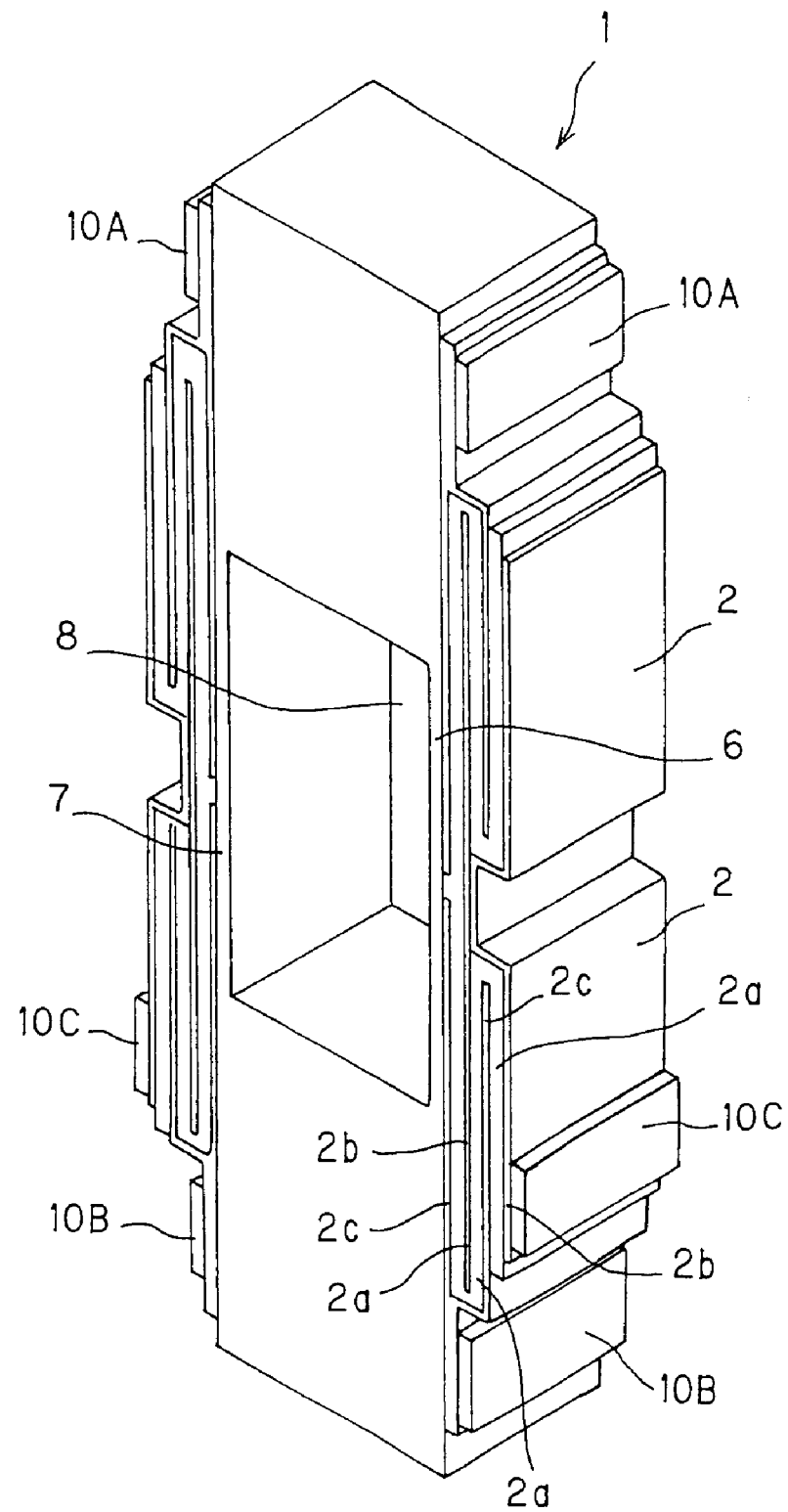
FIG. 16 shows a schematic perspective view depicting still another embodiment of a piezoelectric/electrostrictive device of the present invention.

The device shown in FIG. 16 is different from the device shown in the above-described FIG. 15, and piezoelectric/electrostrictive elements arranged so as to be mutually opposed on the same thin plate portion share both one layer of the piezoelectric/electrostrictive film 2a at the closest side of the thin plate portions 6 and 7 and a second electrode 2b, in the laminating direction of the composing films of the elements. Other structures and methods of driving thereof are the same as for the device shown in FIG. 15. In comparison with the device shown in FIG. 15, the device shown in FIG. 16 is characterized in that a displacement of the movable portion can be made larger since a portion, where thickness is thinner, exists between the piezoelectric/electrostrictive elements 2 arranged mutually opposed on the same thin plate portion.

Figure 17:
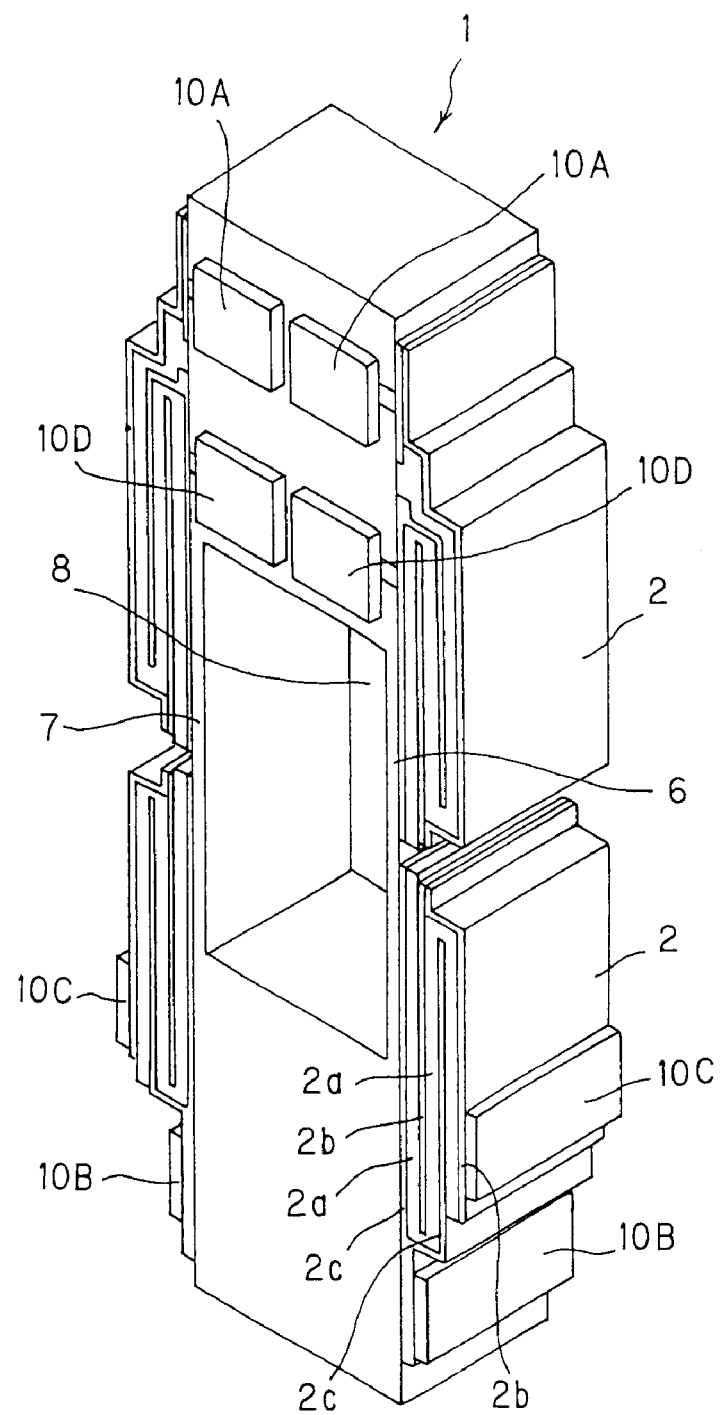
FIG. 17 shows a schematic perspective view depicting still another embodiment of a piezoelectric/electrostrictive device of the present invention.

A device shown in FIG. 17, different from the above-described device shown in FIG. 15, comprises respective piezoelectric/electrostrictive elements 2 arranged so as to be mutually opposed on the same thin plate portion, wherein any of composing films of respective elements are made not to be shared, and respectively arranged independently, and terminals 10 (10A, 10D) for driving elements of the movable portion 4 side on the thin plate portions 6 and 7 are respectively formed on the movable portion 4 on the face where the hole 8 is apertured, with terminals 10B, and 10C for respective piezoelectric/electrostrictive elements 2 of the fixing portion 5 side on both the thin plate portions 6 and 7 formed on the face where elements of the fixing portion 5 are formed. Terminals 10A are terminals for conducting electric signals to second electrodes 2b of the elements of the movable portion side on the thin plate portions 6 and 7, while terminals 10D are terminals for conducting electric signals to first electrodes 2c of the same elements described above. The basic structure and the method of driving of the other elements thereof are also the same as for the device shown in FIG. 15. In comparison with the device shown in FIG. 15, the device shown in FIG. 17 is characterized in that the movable portion thereof can displaces in further greater magnitude, of course, than the device shown in FIG. 15 and also even than the device shown in FIG. 16, as the device shown in FIG. 17 is so structured that only the thin plate portions 6 and 7 exist between the piezoelectric/electrostrictive elements 2 arranged mutually opposed on the same thin plate portions.

Figure 18:
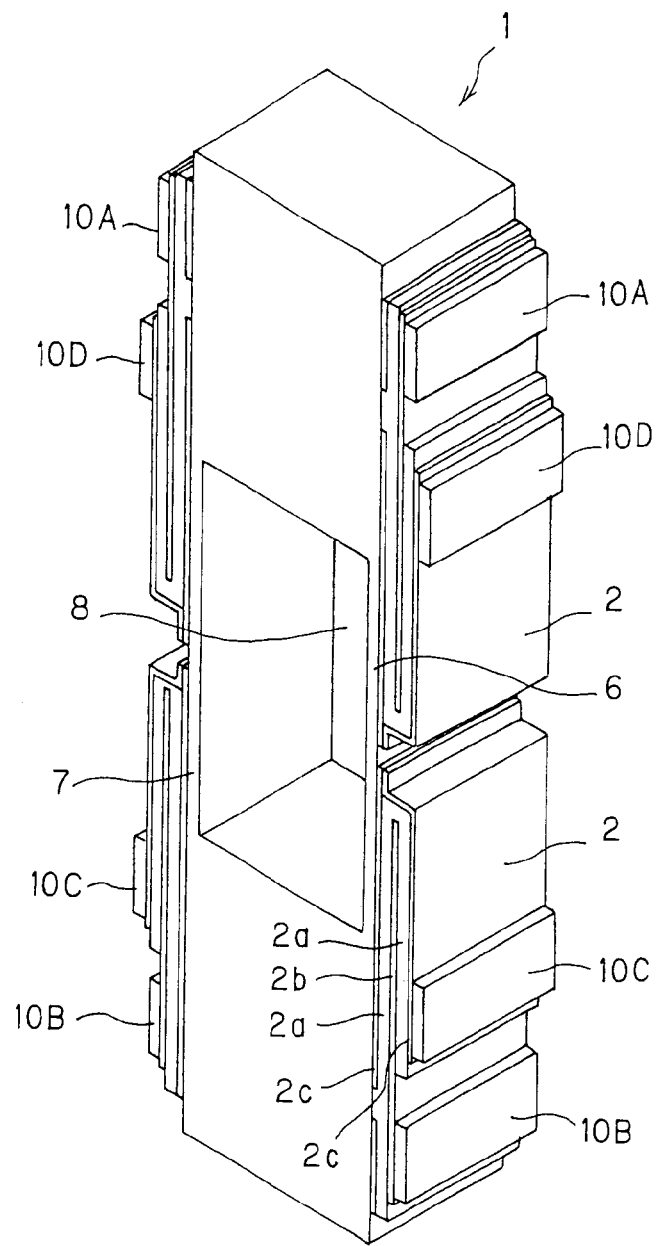
FIG. 18 shows a schematic perspective view depicting still another embodiment of a piezoelectric/electrostrictive device of the present invention.

The device shown in FIG. 18 is a device having a structure that a member comprising a pair of electrodes and a piezoelectric/electrostrictive film is laminated in two stairs in a laminating direction of the composing films of elements. Further, respective piezoelectric/electrostrictive elements arranged mutually opposed on the same thin plate portions 6 and 7 are, similarly with the device shown in FIG. 17, not sharing any composing films, which are respectively arranged independently, and any terminals for conducting electric signals to respective electrodes are formed on the face of the movable portion 4 and the fixing portion 5 where the elements are formed. Structure of elements being different from that of the devices shown in FIGS. 15, 16, and 17, and in two-stair structure, the device shown in FIG. 18 has a characteristic that it is superior in lighter weight and smaller power consumption, while a bit inferior in driving force.

Figure 19:
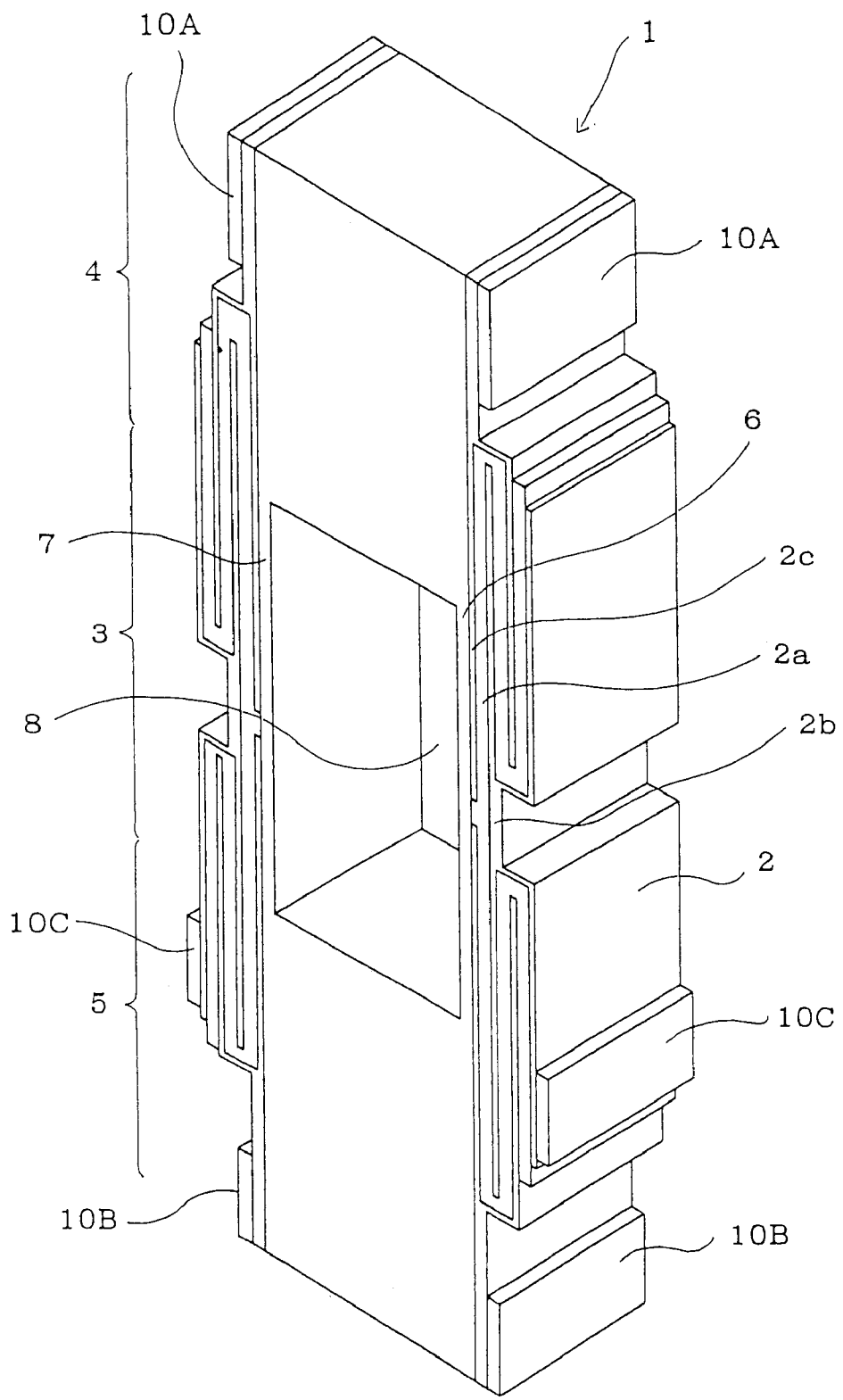
FIG. 19 shows a schematic perspective view depicting still another embodiment of a piezoelectric/electrostrictive device of the present invention.

A device shown in FIG. 19 is shown as an example wherein one end of the first electrode 2c which is used an electrode commonly shared between the respective four elements and one end of terminals 10A and 10B for applying a signal for driving its first electrode 2c are formed on the same position as the ends of the movable portion and the fixing portion. This structure has such a characteristic that it can be produced easily because the patterns of the first electrode 2c and the terminals 10 in addition to the movable portion and the fixing portion are formed simultaneously by the mechanical processing mentioned hereinafter. Additionally, it is possible to keep always the relationship in the position between the relative position of the terminals 10 for the first electrode 2c and the present device itself constant. Therefore, one may easily fit the position between the terminals and the outer apparatuses at the time of setting the present device by taking, for example, the end portion of the fixing portion as a reference.

In the present invention as such, it is also preferable that a piezoelectric/electrostrictive element in a device is composed as a multi-stair structure. The number of the stairs is suitably determined depending on the use application and the specification of the device. As a device according to the present invention has, as can be understood from the embodiments illustrated in the drawings, the distance in the width direction of the thin plate portion basically unchanged, the device has an extremely preferable structure in applying the device to such controlling devices for positioning or suppressing ringing, and the like, a magnetic head for a hard disk drive to be used, for example, in a extremely narrow gap.

By the way, in the second aspect and the third aspect according to the present invention, more specifically in the third aspect, as illustrated in FIGS., 3(a) and (b), by separating (parting) piezoelectric/electrostrictive elements substantially at the center of respective thin plate portions, the thin plate portions become liable to be bent at the separated (parted) positions, and thus individual piezoelectric/electrostrictive elements are made easier to displace. As a result, the displacement of the piezoelectric/electrostrictive element is enabled to be efficiently transferred to the movable portion, which is an advantage. Naturally, depending on the use of the device, the separation may be performed at a position closer to either the movable portion or the fixing portion.

(3) Hole

The shape of a hole 8 formed by inner walls of the driving portion 3, movable portion 4, and fixing portion 5 can be optional as long as it does not hamper operation of the driving portion. As described previously, electrode leads may be provided on the inner walls of a pair of the thin plate portions defining the hole 8.

Further, since a device of the present invention is not necessarily required to compose the entirety thereof with piezoelectric/electrostrictive materials, it has an advantage that members other than the piezoelectric/electrostrictive elements can select materials thereof depending on required features of respective materials. Namely, by composing the members other than the piezoelectric/electrostrictive elements with materials of lighter weight, on operation, the influence of harmful vibration can be reduced, and similarly the mechanical strength, the handling property, the impact resistance, and the humidity resistance thereof can be improved with ease.

Furthermore, as filling materials are not required to be used, the efficiency of a displacement due to the inverse piezoelectric effect or the electrostrictive effect also cannot be reduced.

3. Method of Fabricating Device

Now, a method of fabricating a device according to the present invention is described.

The device according to the present invention comprises respective members composed of ceramic materials, and as comprising members of the device, a base portion except a piezoelectric/electrostrictive element, namely thin plate portions, a fixing portion, and a movable portion are preferably fabricated by use of the ceramic green sheet laminating method, while respective terminals and the piezoelectric/electrostrictive element are preferably fabricated by use of the film forming methods for thin films, thick films, or the like. The ceramic green sheet laminating method which can integrally form respective members, described previously, of the base of the device is an easy method of fabrication which can bring about a joined portion of high reliability and secure the rigidity of the device, as variation with time of the state of the joined portions of respective members is seldom caused. As the device according to the present invention uses the joined portions of thin plate portions, comprising the driving portion, with the fixing portion and the movable portion, as fulcrums for developing displacements, reliability of the joined portions is critically important such that the feature of the device is dominated thereby. As the method is also superior in productivity and formability, a device of a predetermined shape can be obtained in a shorter time and in better reproducibility. It should be noted that, although expressions of a thin plate and a thin plate portion are used in the present specification, in principle, the former indicates a member related with the green sheet in the method of fabrication, while the latter indicates a portion comprising the driving portion together with the piezoelectric/electrostrictive element in a laminated body.

(1) Fabrication of Laminate

Firstly, a slurry is prepared by adding and mixing a binder, a solvent, a dispersant, a plasticizer, and the like into a ceramic powder such as zirconia, or the like, then the slurry is processed for degassing, and then the slurry is used in forming a ceramic green sheet having a predetermined thickness by way of the reverse roll coater method, the doctor blade method, or the like.

Then, by way of die-cutting using a die (punching), laser processing, or the like, the ceramic green sheet is processed into a desired shape. A laminate can be fabricated, in principle, in accordance with a method disclosed in the specification of U.S. Ser. No. 09/441,914 filed on Nov. 17, 1999. The contents of the aforementioned application are incorporated herein by reference.

Figure 11A:
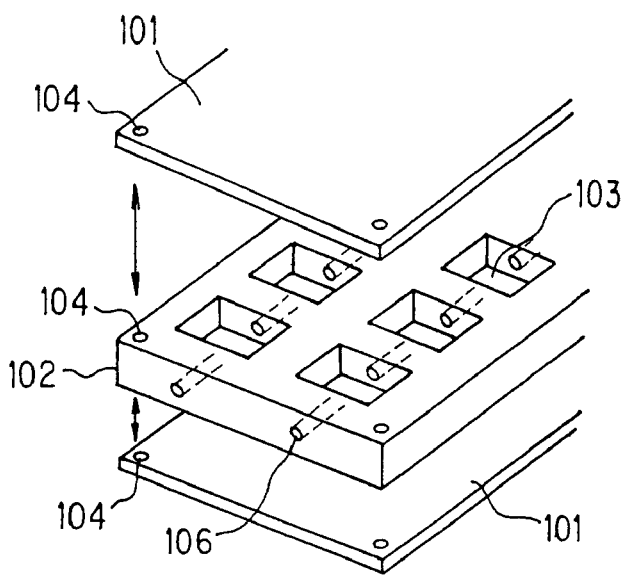
FIGS. 11(a), (b), (c), and (d) show process drawings of one of methods of fabricating a piezoelectric/electrostrictive device of the present invention.
Figure 11B:
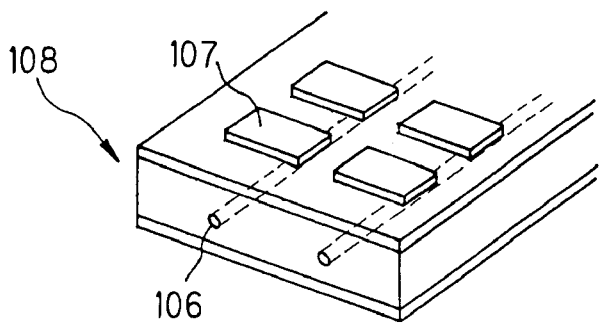
Figure 11C:
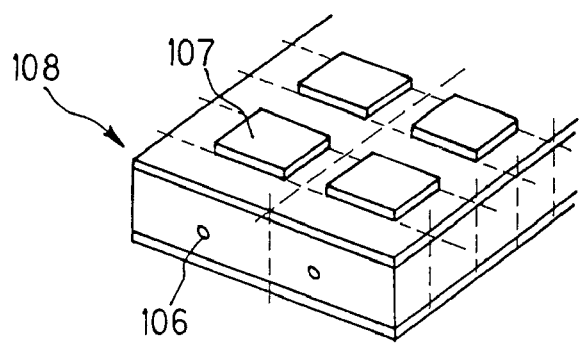
Figure 11D:
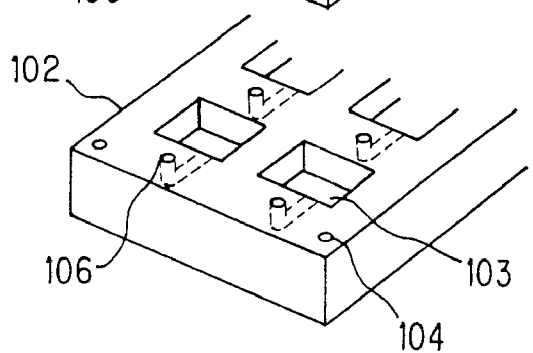

FIG. 11(a) schematically illustrates a ceramic green sheet 101 which is a ceramic green sheet mainly constituting a thin plate after being sintered, and a ceramic green sheet 102 with at least one rectangular hole 103 formed thereon which is a ceramic green sheet to be used for members constituting the movable portion and the fixing portion. With the ceramic green sheet 102, by forming the holes 103 so as to be parallel in one or more rows, a plurality of devices can be obtained at a time, or at least one device having a plurality of movable portions can be obtained. By use of at least two ceramic green sheets constituting the thin plate and at least one ceramic green sheet having at least one hole formed thereon, prepared in advance, for example, between at least two ceramic green sheets constituting the thin plate, at least one ceramic green sheet having the at least one hole formed thereon is laminated to make a ceramic green laminated body comprising a ceramic green sheet constituting a pair of thin plates and a series of ceramic green sheets each having at least one hole formed thereon.

As a matter of course, there is no limitation whatsoever on the preparing method of a ceramic green laminated body, in other words, on laminating sequence of a ceramic green sheet constituting the thin plate, and the ceramic green sheet having the at least one hole formed thereon, and ordinarily lamination is possible at an optional sequence so long as the laminated body causes no inconvenience to the processing steps to follow.

For example, steps for preparing the above-described ceramic green laminated body include a step to laminate ceramic green sheets constituting a pair of thin plates mutually opposed, respectively a step to laminate ceramic green sheets constituting a pair of thin plates mutually opposed on the outermost layer, a step to laminate a ceramic green sheet constituting the thin plate with at least one ceramic green sheet having at least one hole formed thereon, a step to laminate a ceramic green sheet constituting the thin plate with desired number of ceramic green sheets each having at least one hole formed thereon, a step to laminate at least one ceramic green sheet having at least one hole formed thereon with ceramic green sheets constituting a pair of thin plates on the outermost layer mutually opposed, a step wherein two laminates A comprising a ceramic green sheet constituting a thin plate laminated with at least one ceramic green sheet having at least one hole formed thereon are prepared, and a laminated B laminated with one or a plurality of ceramic green sheet each having at least one hole formed thereon is prepared, and when the two laminated bodies A are laminated so that respective thin plates mutually form the outermost layer, the lamination is performed with an intervention of a ceramic green sheet having at least one hole formed thereon or the laminate B, and the like.

It should be noted that when a device according to the present invention is fabricated in such ceramic green sheet laminating method, in some cases, specifically when a hole is formed by laminating a thick sheet, difference in dimensions of lengths of a pair of thin plate portions, which govern the driving portion, is likely to occur because of shrinkage of a ceramic green sheet, deterioration of machining accuracy due to differences in dimension accuracy attributable to machining of a thicker ceramic green sheet, shifting of position due to deformation of a sheet while laminating, or the like. The differences in dimension of a pair of the thin plate portions affects displacement in the right and left directions (the X-axis direction), and in addition a displacement shape of the movable portion is liable to include a component in the rotating direction, thus making the movable portion difficult to dominantly displace toward the major axis direction.

For such problems, a countermeasure includes a step wherein a ceramic green sheet having at least one hole formed thereon mounted on a plastic film is, when laminating at least a plurality of ceramic green sheet with the at least one hole formed thereon, laminated on a surface to be the outermost layer of the ceramic green laminate having the at least one hole formed thereon so the plastic film forms a new outermost layer thereof, and after the hole is accurately positioned, the plastic film is removed. Another countermeasure is a step wherein a ceramic green sheet having at least one hole formed thereon mounted on a plastic film is laminated with a ceramic green sheet constituting the thin plate so that the plastic film forms an outer layer thereof, and after the hole is accurately positioned, the plastic film is removed, and by employing the step, not only deformation while handling the ceramic green sheet is substantially avoided, but also both surfaces constituting the outermost layers are made in the same shape, thus enabling accurate positioning of the hole. As a result, precision in lamination is improved, dimension is stable due to improved manufacturing precision, and a feature as a device, for example, displacement feature, is improved.

Further, of the methods of fabricating using a plastic film described previously, the former method is high in laminating efficiency required in obtaining the final laminate, and is also an effective method in reducing the number of steps required in fabricating. While, the latter method is also an advantageous method in providing a bonding assistant layer to be described later for securing bonding properties of laminating interface.

With regard to the number of laminating steps, the former is an efficient method, as lamination of a ceramic green sheet formed on a plastic film with another ceramic green sheet having a hole thereon can be performed in one step, and respective lamination of mutually opposing surfaces where a plastic film is peeled off and removed after lamination with a ceramic green sheet constituting a thin plate can be performed in one step, and for example, total number of lamination required can be in two steps in the minimum. However, with the latter, mutually opposing thin plate portions are formed by laminating a ceramic green sheet constituting the thin plate with a ceramic green sheet having a hole thereon mounted on a plastic film respectively by separated steps, and thereafter to be laminated with a ceramic green sheet having a hole formed thereon. Therefore, the total number of laminating steps required is a minimum of three, and more lamination steps are required than the former method.

On the other hand, a bonding assistant layer for improving the laminating property of a ceramic green sheet is ordinarily formed over a substantially entire area of the ceramic green sheet prior to processing of a hole and the like, and thereafter a predetermined hole is formed by the punching or the like by use of a die, then a predetermined number of the ceramic green sheets are laminated. If this is applied to the former method, the bonding assistant layer is required to be formed on a laminating surface with the thin plate after the film is removed. At this time, in spite of the fact that shaping is exactly done by way of mold machining or the like, there is a great possibility that the shaping precision is deteriorated by formation of the bonding assistant layer. Although there is also a means to provide a bonding assistant layer for a green sheet constituting a thin plate, this causes deterioration of the feature as the device, not only by the variation in total thickness which is increased because the ordinary variation in thickness of a bonding assistant layer is larger than the variation in thickness of the ceramic green sheet constituting the thin plate, but also by the thickness of the thin plate which is increased as much the thickness of the bonding assistant layer. Contrarily, when the bonding assistant layer is applied to the latter method, high reliability in lamination and high dimension precision can be compatible, since the bonding assistant layer can be formed on the ceramic green sheet in a state mounted on a plastic film, and a hole can be processed after the bonding assistant layer is formed. Thus, the precision of the hole can be secured by the precision of the die, and the ceramic green sheet constituting the thin plate is untouched in any way. The surface where the plastic film is peeled off and removed is secured of the reliability in lamination by the bonding assistant layer formed on another ceramic green sheet, having a hole formed thereon, to be laminated on the surface.

Although the former method and the latter method have a common object to obtain stability of the shape of the thin plate portions, they have respective characteristics in their processes of fabricating, and the methods are subjected to suitable selection depending upon the structure and the like of a laminate.

It should be noted that a ceramic green sheet having at least one hole formed thereon mounted on a plastic film and is not only a ceramic green sheet having at least one hole formed thereon prepared by the die cutting machining or the laser machining of the ceramic green sheet on a plastic film, but also includes a ceramic green sheet having at least one hole formed thereon formed in advance in a predetermined shape, and further prepared by attaching a plastic film thereon. The plastic film is, in view of exfoliating property, strength, or the like, preferably a poly(ethylene terephthalate) film. Further, a ceramic green sheet mounting surface of the plastic film is preferably a film coated with a release agent containing silicone or the like as components, with an object of increasing the releasing property of the green sheet. Furthermore, the thickness of the ceramic green sheet on the plastic film is preferably thinner, and desirably the thickness being equivalent to the thickness of the ceramic green sheet for the thin plate, which is more preferable. The reason being that by thinning the thickness of the ceramic green sheet, the machining precision of the ceramic green sheet per se is increased. It should be noted that in order to make easier the handling of respective ceramic green sheets, more specifically a ceramic green sheet constituting the thin plate, to prevent elongation and the surface waviness of a sheet, and to secure stability of the shape of the thin plate portion, it is preferable to handle a ceramic green sheet in a form attached to the plastic film described previously.

Hereinafter, some descriptions are made about specific examples of the cases where a ceramic green laminate is prepared. Naturally, the examples hereinafter illustrated are merely examples, and the cases where a ceramic green sheet is prepared are not limited thereto.

LAMINATION EXAMPLE 1

Figure 20:
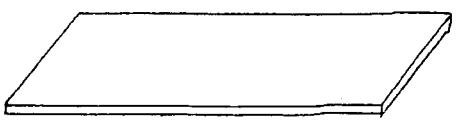
FIG. 20 schematically shows examples of respective ceramic green sheets to be used for a ceramic green sheet laminated body in a method of fabricating a piezoelectric/electrostrictive device according to the present invention.
Figure 20:
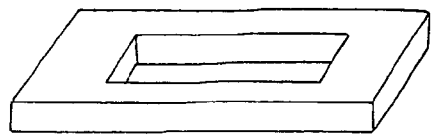
Figure 20:
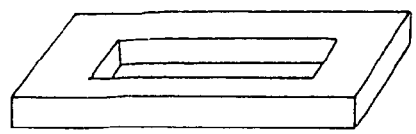
Figure 20:
Figure 20:
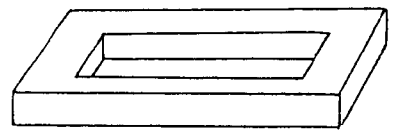
Figure 20:
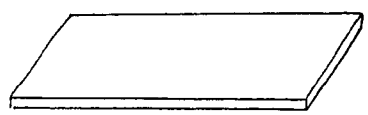

After sequentially laminating a ceramic green sheet (hereinafter referred to as "GS") 1 for the thin plate, GS1 having a hole formed thereon (hereinafter referred to as "with a hole"), GS2 with a hole, GS3 with a hole, GS4 with a hole, and GS2 for the thin plate, all shown in FIG. 20, the lamination is subjected to a compression to produce an integrally laminated ceramic green body.

LAMINATION EXAMPLE 2

Step 1: After laminating GS1 for the thin plate over GS1 with a hole, the lamination is subjected to compression to produce an integrally laminated ceramic green body.

Step 2: After laminating GS4 with a hole over GS2 for the thin plate, the lamination is subjected to compression to produce an integrally laminated ceramic green body.

Step 3: After sequentially laminating the integrally laminated ceramic green body obtained in step 1, GS2 with a hole, GS3 with a hole, and an integrally laminated ceramic green body obtained in step 2, the lamination is subjected to compression to produce an integrally laminated ceramic green body.

LAMINATION EXAMPLE 3

Step 1: After sequentially laminating GS1 with a hole, GS2 with a hole, GS3 with a hole, and GS4 with a hole, the lamination is subjected to compression to produce an integrally laminated ceramic green body.

Step 2: After sequentially laminating GS1 for the thin plate, an integrally laminated ceramic green body obtained in step 1, and GS2 for the thin plate, the lamination is subjected to compression to produce an integrally laminated ceramic green body.

LAMINATION EXAMPLE 4

Step 1: After laminating GS2 with a hole over GS3 with a hole, and the lamination is subjected to compression to produce an integrally laminated ceramic green body.

Step 2: After sequentially laminating GS1 for the thin plate, GS1 with a hole, an integrally laminated ceramic green body obtained in step 1, GS4 with a hole, and GS2 for the thin plate, the lamination is subjected to compression to produce an integrally laminated ceramic green body.

The integrally laminated ceramic bodies obtained in the above-described lamination examples 1 to 4 are sintered to produce integrated sintered bodies. However, examples described above do not represent all methods of fabrication of the present invention, and there is no specific limitation whatsoever for the number and the sequence for the integrating lamination.

Depending on a structure, for example, the shape of the hole, the number of the ceramic green sheets with a hole, the number of the ceramic green sheets for the thin plate, and the like, the number and the sequence for the integrating lamination are suitably determined so that an integrated sintered body of desired structure can be obtained.

Naturally, the shape of a hole is not necessarily the same, and is determined depending on a desired function. Further, there are also no specific limitation whatsoever on the number and the thickness of respective ceramic green sheets.

The above-described compression can further improve the laminating properties by heating, thus compression under heating atmosphere can be advantageously employed. As the laminating property of a ceramic green sheet interface can be improved by applying a paste, slurry, or the like containing a ceramic powder (preferably, of composition the same as or similar to the ceramic powder used for the ceramic green sheet, in view of securing reliability), and a binder as the major component, on the ceramic green sheet, and printing thereon, thus a bonding assistant layer can be made, it is also desirable to use the bonding assistant layer.

Further, a protrusion may be provided on the outermost layer of the ceramic green sheet laminate, at a portion except for at least the thin plate portion on at least one side of the outer layer surface thereof. Although the device according to the present application is to be formed of a piezoelectric/electrostrictive element on the outer surface of mutually opposing thin plate portions ordinarily by known means such as the screen printing method, when, for example, the piezoelectric/electrostrictive element is formed by the screen printing method, the element is prevented from a damage, since the surface of the element formed on an opposite surface has no chance to directly touch a stand such as a printing stage, a sintering setter, or the like, because of the protrusion formed. Furthermore, by suitably selecting the height of the protrusion, the thickness of the element can also be controlled. Whereas the protrusion can be formed also for a sintered body of green laminate, namely a ceramic laminate, it is preferable to form the protrusion for a green laminate, and then to sinter for integration, in view of the stability as a structure and the stability in dimensions.

As shown in FIG. 11($a$), a green laminate can be obtained by sequentially laminating, while positioning by use of a reference hole 104, a ceramic green sheet 101 constituting a thin plate, a ceramic green laminate 102 prepared by laminating a desired number of ceramic green sheets each having at least one hole formed thereon, and a ceramic green sheet constituting a thin plate, in this order, and then integrating by means of above-described compression under heating, or the like. Although not shown, when the thickness of the ceramic green laminate is too thick, a green laminate having the thickness thereof halved in advance into upper and lower portions is first formed, and the final green laminate may be obtained by bonding the portions together so as to have the holes facing each other.

With regard to a laminate 108, it is necessary to have communicating holes 106 for communicating with the outside space and portions to be holes 103 on a ceramic green sheet 102 and formed in advance on the ceramic green sheet 102, or the communicating holes 106 are to be bored after the laminate is made. However, as long as respective holes 103 are communicated with the outside space, the shape of the communicating holes 106 is not specifically limited, and in addition to shapes penetrating through a plurality of holes 103 as shown in FIGS. 11($a$), and ($b$), it may be structured so that respective holes 103 are individually communicated with the outside space as shown in FIG. 11($d$). Then, the ceramic green laminate thus integrated by one of these methods is sintered at a temperature around 1200 to 1600° C. as to be described hereinafter. A ceramic laminate thus obtained by the sintering, however, may have an unintended warping. In such case, it is preferable to flatten by refiring (hereinafter referred to as "warping correction") at a temperature close to the previously described sintering temperature with a weight placed thereon. When performing the warping correction, a porous ceramic plate such as a planar alumina, or the like may be preferably used as the weight. Further, in addition to the warping correction following the sintering, it can be preferably performed simultaneously with sintering with the weight placed in advance at the sintering.

(2) Formation of Piezoelectric/Electrostrictive Element

A piezoelectric/electrostrictive element 107 can be formed on a surface of a thin plate of a ceramic laminate in the required number, when fabricating the device of the present invention, by the thick film forming method, such as the screen printing method, the dipping method, the coating method, the electrophoresis method, or the like, or the thin film forming method, such as the ion beam method, the sputtering method, the vacuum deposition method, the ion plating method, the chemical vapor deposition method (CVD), plating, or the like (refer FIG. 11($b$). Meanwhile, FIG. 11($b$) schematically shows a piezoelectric/electrostrictive element 107, however, it does not exactly show the arrangement of the piezoelectric/electrostrictive element 107 in the device of the present application.).

By forming the piezoelectric/electrostrictive element by the film forming methods, the piezoelectric/electrostrictive elements and the thin plate portions can be integrally joined and provided without using an adhesive, thus enabling reliability and reproducibility to be secured, and integration to be made easy. However, in the method of fabrication in the present invention, it is preferable to form the piezoelectric/electrostrictive element 107 by the thick film method. The reason being that, by use of the method, a piezoelectric/electrostrictive film can be formed by use of a paste, slurry, or suspension, emulsion, sol, or the like of piezoelectric ceramic particles of average particle size of 0.01 to 5 $\mu$m, preferably 0.05 to 3 $\mu$m as the major component, and a favorable piezoelectric operating feature is obtained therefrom. Specifically, the electrophoresis method is advantageous in that a film can be formed in high density and in high shape precision. Further, being capable of simultaneously forming a film and a pattern, the screen printing method is preferably employed as a method of fabricating the device according to the present invention.

Specifically, after sintering a ceramic green laminate 108 at predetermined conditions, preferably at 1200 to 1600° C., on a predetermined position of a surface of a thin plate (a sintered ceramic green sheet 101), respectively at predetermined portions, in accordance with the three aspects of the device according to the present invention, sequentially printed and sintered are a first electrode, then a piezoelectric/electrostrictive film, and further a second electrode, thus a piezoelectric/electrostrictive element is formed. Further, electrode leads are printed and sintered for connecting electrodes with a driving circuit. Here, if materials are selected so as to have sintering temperatures for respective members gradually becoming lower, such as platinum (Pt) for the first electrode, lead zirconate titanate (PZT) for the piezoelectric/electrostrictive film, gold (Au) for the second electrode, and silver (Ag) for the electrode leads, re-sintering of the materials once sintered is avoided at any sintering stages, and occurrence of troubles such as exfoliation or aggregation of electrode materials or the like can be avoided.

In addition, by suitably selecting materials, respective members and electrode leads of the piezoelectric/electrostrictive element 107 can be sequentially printed to be integrally sintered at one time, while respective electrodes and the like can be provided at a lower temperature after the piezoelectric/electrostrictive film is formed. Further, there is no problem that respective members and electrode leads of the piezoelectric/electrostrictive element are also formed by the thin film forming method such as the sputtering method, the vapor deposition method, or the like, and in such case, a heat treatment is not necessarily required. In addition, it is also preferable that a piezoelectric/electrostrictive element 107 is formed in advance on a ceramic green sheet 101 at a position at least finally to be a thin plate portion, and a ceramic green laminate 108 and the piezoelectric/electrostrictive element are co-fired. When co-firing, one method is to co-fire all composing films of a piezoelectric/electrostrictive element, another method is to co-fire only a first electrode and a ceramic green sheet 101, and still another method is to co-fire the composing films except a second electrode and the ceramic green sheet 101, or the like. As a method for co-firing the piezoelectric/electrostrictive element 107 and the ceramic green laminate 108, a method is that a piezoelectric/electrostrictive film is formed by the press molding method by use of a mold, the tape forming method by use of a slurry material, or the like, the piezoelectric/electrostrictive film still to be sintered is laminated at a predetermined position on the ceramic green sheet 101 by the compression under heating or the like, then co-fired to produce a movable portion, a driving portion, thin plate portions, and piezoelectric/electrostrictive films at the same time. However, in this method, electrodes are required to be formed in advance on the thin plates or the piezoelectric/electrostrictive films by use of the film forming methods described previously. Further, in addition to the above-described method, it is also possible to form electrodes and piezoelectric/electrostrictive films, which being respective composing layers of the piezoelectric/electrostrictive element, on a ceramic green sheet 101 at a position at least finally to be a thin plate portion by the screen printing method, to be co-fired.

A sintering temperature of a piezoelectric/electrostrictive film is suitably determined by materials composing the same, and it is generally 800 to 1400° C., and preferably 1000 to 1400° C. In this case, in order to control composition of the piezoelectric/electrostrictive film, it is preferable to sinter under the presence of an evaporating source of materials of the piezoelectric/electrostrictive film. In addition, when a piezoelectric/electrostrictive film and a ceramic green laminated body 108 are co-fired, sintering conditions of the both are to be matched.

Further, when a device having a piezoelectric/electrostrictive element respectively on both portions of a pair of opposing thin plate portions is fabricated, a piezoelectric/electrostrictive film, an electrode, and the like are respectively printed on both sides of a ceramic laminate. In such case, it is necessary to take a measure lest piezoelectric/electrostrictive films, electrodes, and the like, printed on the ceramic laminated body should attach to, or come in contact with, a printing stage by ①printing on a printing stage having a cavity thereon, or ②firstly forming a convex in a frame-form on the periphery of a printing position on at least one of the printing surfaces of a ceramic laminate, then the surface with the convex formed thereon is printed, and then the other surface is printed, or the like. Further, particularly when a piezoelectric/electrostrictive element is respectively formed on both surfaces of a ceramic laminate, it is preferable to have the same sintering atmosphere on both surfaces at sintering the piezoelectric/electrostrictive film described previously. For example, ordinarily a ceramic laminate with a piezoelectric/electrostrictive element (film) formed thereon is placed on a board such as a setter or the like for sintering, and in this case, intervals between setters to be piled up are adjusted so that spacing between a piezoelectric/electrostrictive film and a setter is the same for respective stages.

(3) Cutting Laminated Body

A sintered laminate with the above-described piezoelectric/electrostrictive element formed thereon is, after a notch is formed thereon, and a piezoelectric/electrostrictive element and electrode leads are treated for coating, shielding, or the like, depending on requirements, cut in a laminating direction of a ceramic green sheet, such that a rectangular hole 103 apertures on the side of a laminate. Thus, a plurality of devices can be simultaneously obtained (FIG. 11(c)). As a method of cutting, in addition to dicing machining, wire-saw machining, or the like (mechanical machining), laser beam machining by use of YAG laser, excimer laser, or the like, and electron-beam machining can be applied. When cutting into respective desired units, it is preferable to have the cut bodies subjected to heat treatment at 300 to 800° C. The reason being that whereas defects such as micro-cracks or the like are likely to be caused inside a sintered body by the machining, the defects can be removed by the heat treatment, thus improving reliability. Further, it is also preferable to have the sintered body subjected to aging treatment by leaving it at least for about 10 hours at about 80° C. after the above-described heat treatment. By this treatment, various stresses and the like suffered during the fabricating process are mitigated to contribute to improvement of the features.

In the method of fabricating a device of the present invention, a hole of a desired shape, for example, a hole 103 in the rectangular shape, is cut so as to aperture on a side of a laminate. Such cutting has advantages not only in separating a plurality of devices, but also being capable of simultaneously forming thin plate portions and a hole (in the device 1 of FIG. 3(a), the thin plate portions 6 and 7 and the hole 8), and it is desirable that a structure where two or more rectangular solids are coupled by thin plates, the structure being complicated and difficult to be fabricated, can be obtained with ease.

Further, by suitably changing the number and the position of formation of holes 103 in a ceramic green sheet 102, or the cutting position of a laminate 108, a device with a plurality of driving portions formed thereon and a device having driving portions in different lengths can be formed with extreme ease. Furthermore, by simultaneously cutting a laminate 108 and a piezoelectric/electrostrictive element 107, devices with thin plate portions and piezoelectric/electrostrictive elements in the same width can be made with ease, which is preferable. Although these cuttings can be performed in a green state prior to sintering, in order to increase dimension precision and to prevent grain release of respective ceramic powders, it is preferable to cut a sintered body.

Further, a device according to the present invention can be made by the press molding method or the casting method, the injection molding, the photolithography, or the like, in addition to the methods of preparation described above by use of a ceramic green sheet. Alternatively, the device can be made by bonding respective members prepared as separate bodies, but this method has a problem also in reliability as damages are likely to occur at joined portions, in addition to the low productivity.

4. Application Example of Device

Figure 12A:
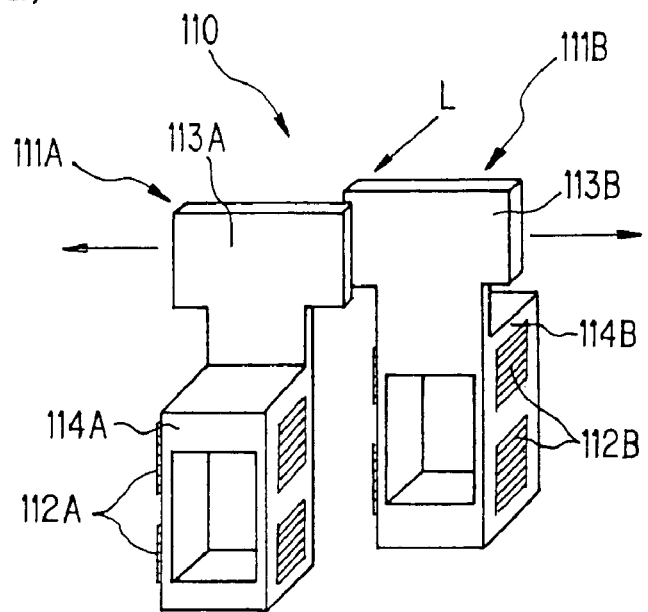
FIGS. 12(a) and (b) show schematic perspective views depicting an example of an optical shutter with a device according to the present invention mounted thereon.
Figure 12B:
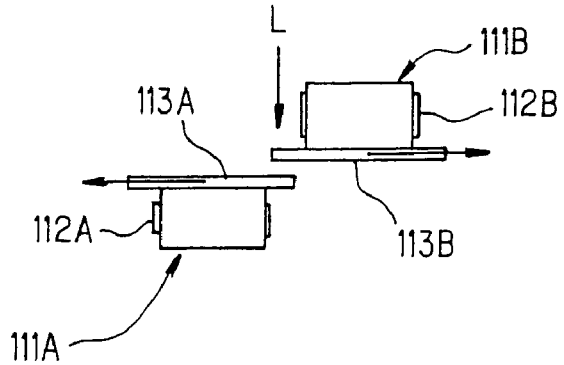

Lastly, as one of application examples of a device of the present invention, an example where the device of the present invention is applied to a displacement element for an optical shutter is described with reference to drawings. FIGS. 12(*a*) and (*b*), and FIGS. 13(*a*), (*b*), and (*c*), show schematically examples where devices of the present invention are applied to displacement elements for optical shutters, and it can be easily understood that the examples do not exactly represent structures according to the present application. By the way, an "optical shutter" in the present application means a functional element for controlling transmission and shielding of the light by relative movement of two shielding plates, and as it can perform ON/OFF control and quantity control of the light, it can be functioned as an optical switch or an optical diaphragm.

When a device of the present invention is mounted on an optical shutter, at least one of two shielding plates is mounted on a movable portion of the device of the present invention.

For example, an optical shutter 110 shown in FIGS. 12(*a*) and (*b*) comprises two units IIIA and IIIB each provided with a device of the present invention and a shielding plate. Two shielding plates 113A and 113B are respectively mounted on movable portions 114A and 114B, and arranged so that mutual planar surfaces are in parallel, and parts of the surfaces of the respective planar plates mutually overlap toward the incident direction of the light L.

The optical shutter 110 shields the light L in the state shown. However, by applying voltages of the same phase to piezoelectric/electrostrictive elements 112A and 112B respectively formed on driving portions of the devices, the shielding plate 113A moves to the left-hand side in FIG. 12(*a*), and the shielding plate 113B moves to the right-hand side in FIG. 12(*a*), causing to change the overlapping condition of the shielding plates 113A and 113B, thus ON/OFF control and quantity control of the light can be performed.

Figure 13A:
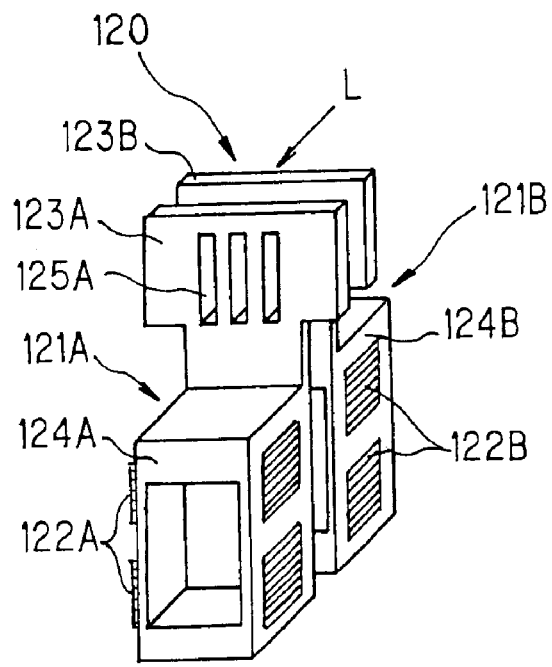
FIGS. 13(a), (b), and (c) show schematic perspective views depicting another example of an optical shutter with a device according to the present invention mounted thereon.
Figure 13C:
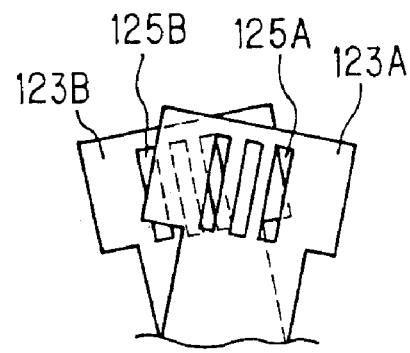
FIG. 13(c) is an enlarged view of shields.
Figure 13B:
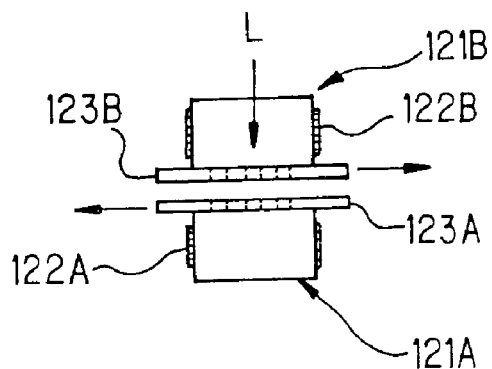
FIG. 13(b) is a top view.
Figure 14:
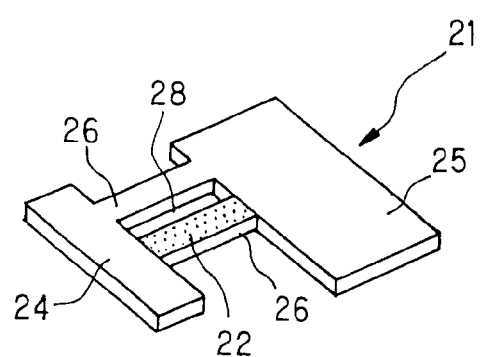
FIG. 14 is a schematic perspective view depicting an embodiment of a conventional piezoelectric actuator.

Further, an optical shutter 120 shown in FIG. 13(*a*) comprises two units 121A and 121B respectively comprising a device of the present invention and a shielding plate, two shielding plates 123A and 123B are respectively mounted on movable portions 124A and 124B of respective devices, and arranged so that mutual planar surfaces are in parallel, and the surfaces of the planar plates are totally overlapped toward the incident direction of the light. At opposing positions of the shielding plates 123A and 123B, slits 125A and 125B are respectively formed.

Although the optical shutter 120 transmits the light L through the slits 125A and 125B in the state shown in FIGS. 13 (*a*) and (*b*), by applying voltages of the same phase to piezoelectric/electrostrictive elements 122A and 122B respectively formed on driving portions of the devices, the shielding plate 123A moves to the left-hand side in FIG. 13(*b*), and the shielding plate 123B moves to the right-hand side in FIG. 13(*b*), causing to change the overlapping condition of the slits 125A and 125B, thus ON/OFF control and quantity control of the light can be performed. Whereas FIG. 13(*c*) shows a state where a part of the light is transmitted, by changing shapes and formation positions of the slits 123A and 123B, the light can also be completely shielded.

Contrarily, in a state of FIGS. 13(*a*) and (*b*), the slits 125A and 125B may be structured not to be mutually overlapped and to shield the light L, and by moving the shielding plates 123A and 123B, the slits 125A and 125B are overlapped to transmit the light L. Although, in examples of FIGS. 12(*a*) and (*b*), and FIGS. 13(*a*), (*b*), and (*c*), illustrated are examples where two shielding plates are respectively mounted on the devices, the optical shutter of the present invention has at least one shielding plate mounted on a device, and only by moving the one shielding plate, transmission and shielding of the light can be controlled. However, it is preferable to have both shielding plates mounted, as this enables an increase in the relative moving quantity of the shielding plates. Further, although examples in FIGS. 12(*a*) and (*b*), and FIGS. 13(*a*), (*b*), and (*c*) illustrate optical shutters each composed of two units, an optical shutter may be composed of three or more units. In this case, by setting movement of a plurality of shielding plates in a variety of directions, the optical shutter may be used as an optical diaphragm or the like having overlapped portion in varied degrees of aperture. As the optical shutter of the present invention has a shielding plate mounted on the movable portion of the device of the present invention, operation of the shielding plate in a flapped direction is suppressed. In other words, as the shielding plate always moves facing straight to the incident direction of the light, it can be preferably used in view of ON/OFF control and quantity control of the light in improved precision, which are made possible by the present invention.

A device according to the present invention can firstly increase a driving force and displacement quantity by simultaneously driving elements at least positioned in diagonal directions across a hole and having the same functions. Further, as the device can suppress displacement in the rotational mode of a movable portion, and can be displacement shapes of a pair of thin plate portions, into rotationally symmetric in the mutual relation, which are displacement mechanism capable of largely displacing in the X-axis direction, secondly the conversion efficiency of a driving force into a displacement can be increased, thus a larger displacement dominantly to a specific axis, namely the x-axis, is made possible.

In addition, as a piezoelectric/electrostrictive element is formed on a joined portion of a fixing portion and a movable portion with thin plate portions in the aspect, the mechanical strength at the portion is secured and a device with a higher responsive speed at higher resonant frequency can be realized.

Since a device according to the present invention is characterized by having high rigidity in the width-wise direction, that is, Y-axis direction of the thin plates, it is a structure that enables solid bonding in mounting thereon functional members such as a sensor, a magnetic head, or the like, and further in mounting the present device per se to another structure. In addition, on account of the rigidity, the device also has another characteristic that a member of relatively larger mass can be mounted. Further, since the rigidity is relatively smaller in the thickness direction than in the width direction of the above-described thin plate portions, exhibited is an effect that a component in the Y-axis direction or a flapped component, which is a displacement component when the device is operated, is effectively suppressed, based on the directional property of the rigidity. Furthermore, since the device of the present invention is so structured that a piezoelectric/electrostrictive operating portion for developing displacement is overlapped not only with thin plate portions but also with a fixing portion or movable portion, displacement shape of a driving portion is different from the disclosure in JP-A-63-64640. Namely, instead of a configuration where only the vicinity of the center in a direction of the thin plate portions from a movable portion toward the fixing portion is directed toward a direction of the hole of the device of the invention of the present application, and the joined portions of thin plate portions with a fixing portion and thin plate portions with a movable portion are scarcely displaced, the device of the present invention is structured to have such a configuration that enables the joined portion of a movable portion with the thin plate portions to displace toward the outside space, thus the present application can have a displacement mechanism permitting the movable portion to largely displace.

Further, a fixing portion and a movable portion and thin plate portions of the present device are sintered into an integrated body of ceramics, and a piezoelectric/electrostrictive element has a structure integrated by sintering with the thin plate portions, the fixing portion, and the movable portion, by the film forming method, without use of any adhesives, and thus the present device has a structure which is free from variations such as displacement drifting with time caused by the presence of adhesives, or the like. As described previously, joined portions of the driving portion or the thin plate portions with the fixing portion and the driving portion or the thin plate portions with the movable portion are structured to be borderless without any intervention by the third substances/materials, and therefore are of a structure having high rigidity, and can be easily made to make high resonant frequency permitting high speed operation. Thus, the device according to the present invention is structurally and functionally entirely different from an actuator disclosed in the official gazette of Japanese Patent Application Laid-Open No. 63-64640, and is high in reliability.

Accordingly, the device according to the present invention can be utilized not only as active elements such as a variety of transducers, a variety of actuators, frequency domain functional components (filters), transformers, vibrators and resonators for communications and powers, oscillators, discriminators, and the like, but also as sensor elements for a variety of sensors such as ultrasonic sensors and acceleration sensors, angular velocity sensors and impact sensors, mass sensors, and the like. More specifically, the device can be preferably utilized for a variety of actuators used for mechanisms for adjusting displacement, positioning and angle of a variety of precision parts and the like of optical apparatuses, precision apparatuses, and the like.

What is claimed is:

1. A piezoelectric/electrostrictive device comprising a driving portion to be driven by displacement of a piezoelectric/electrostrictive element, a movable portion to be operated by driving said driving portion, and a fixing portion for holding said driving portion and said movable portion, said fixing portion and said movable portion being coupled via said driving portion along a length direction of said device, and a hole formed by inner walls of the driving portion, an inner wall of the movable portion, and an inner wall of the fixing portion;

said piezoelectric/electrostrictive device being characterized in that said driving portion is composed of a mutually opposed pair of thin plate portions and at least first and second piezoelectric/electrostrictive elements each comprising one or more pairs of electrodes and a ceramic piezoelectric/electrostrictive film;

wherein one end of said first piezoelectric/electrostrictive element and a piezoelectric/electrostrictive operating portion thereof at said end are positioned on the fixing portion and extend in said length direction to a least a part of a first one of the thin plate portions such that an opposite end of said piezoelectric/electrostrictive operating portion of said first piezoelectric/electrostrictive element is positioned on said first thin plate portion;

wherein one end of said second piezoelectric/electrostrictive element and a piezoelectric/electrostrictive operating portion thereof at said end are positioned on the movable portion and extend in said length direction to at least a part of the second one of said thin plate portions such that an opposite end of said piezoelectric/electrostrictive operating portion of said second piezoelectric/electrostrictive element is positioned on said second thin plate portion; and wherein said hole has a central axis that extends in an axial direction substantially parallel to said thin plate portions and substantially perpendicular to said length direction, and said device is free of any other holes extending in any direction other than said axial direction.

2. A piezoelectric/electrostrictive device according to claim 1, further comprising, on an outer surface of at least one of the thin plate portions, a third piezoelectric/electrostrictive element comprising one or more pairs of electrodes and a ceramic piezoelectric/electrostrictive film, at least one end of the third piezoelectric/electrostrictive element and a piezoelectric/electrostrictive operating portion thereof at said at least one end are arranged on the movable portion or the fixing portion and extend to at least a part of the first or second thin plate portions, respectively, and an opposite end of said piezoelectric/electrostrictive operating portion of said third piezoelectric/electrostrictive element is arranged on the first or second thin plate portions, respectively, such that said third piezoelectric/electrostrictive element is mutually opposed to one of the first and second piezoelectric/electrostrictive elements in a diagonal direction across said hole.

3. A piezoelectric/electrostrictive device according to claim 2, wherein said third piezoelectric/electrostrictive element is formed on said first thin plate portion.

4. A piezoelectric/electrostrictive device according to claim 2, wherein said opposite ends of the piezoelectric/electrostrictive operating portions of any two piezoelectric/electrostrictive elements provided mutually opposed on the outer surface of the same thin plate portion are arranged at positions not to exceed one half of the length of the respective thin plate portion.

5. A piezoelectric/electrostrictive device according to claim 3, wherein said opposite ends of the piezoelectric/electrostrictive operating portions of any two piezoelectric/electrostrictive elements provided mutually opposed on the outer surface of the same thin plate portion are arranged at positions not to exceed one half of the length of the respective thin plate portion.

6. A piezoelectric/electrostrictive device according to claim 1, wherein two of the piezoelectric/electrostrictive elements that are provided mutually opposed on the outer surface of the same thin plate portion share a ceramic piezoelectric/electrostrictive film.

7. A piezoelectric/electrostrictive device according to claim 3, wherein two of the piezoelectric/electrostrictive elements that are provided mutually opposed on the outer surface of the same thin plate portion share a ceramic piezoelectric/electrostrictive film.

8. A piezoelectric/electrostrictive device according to claim 2, wherein two of the piezoelectric/electrostrictive elements that are provided mutually opposed on the outer surface of the same thin plate portion have the same function.

9. A piezoelectric/electrostrictive device according to claim 3, wherein two of the piezoelectric/electrostrictive elements that are provided mutually opposed on the outer surface of the same thin plate portion have the same function.

10. A piezoelectric/electrostrictive device according to claim 2, wherein two of the piezoelectric/electrostrictive elements that are provided mutually opposed on the outer surface of the same thin plate portion have different functions.

11. A piezoelectric/electrostrictive device according to claim 1, wherein piezoelectric/electrostrictive elements existing in mutually diagonal directions across said hole have the same function.

12. A piezoelectric/electrostrictive device according to claim 2, wherein piezoelectric/electrostrictive elements existing in mutually diagonal directions across said hole have the same function.

13. A piezoelectric/electrostrictive device according to claim 3, wherein piezoelectric/electrostrictive elements existing in mutually diagonal directions across said hole have the same function.

14. A piezoelectric/electrostrictive device according to claim 1, wherein piezoelectric/electrostrictive elements existing in mutually diagonal directions across said hole have mutually different functions.

15. A piezoelectric/electrostrictive device according to claim 2, wherein piezoelectric/electrostrictive elements existing in mutually diagonal directions across said hole have mutually different functions.

16. A piezoelectric/electrostrictive device according to claim 3, wherein piezoelectric/electrostrictive elements existing in mutually diagonal directions across said hole have mutually different functions.

17. A piezoelectric/electrostrictive device according to claim 1, wherein at least one of said piezoelectric/electrostrictive elements has a multi-layered piezoelectric/electrostrictive operating portion.

18. A piezoelectric/electrostrictive device according to claim 2, wherein at least one of said piezoelectric/electrostrictive elements has a multi-layered piezoelectric/electrostrictive operating portion.

19. A piezoelectric/electrostrictive device according to claim 3, wherein at least one of said piezoelectric/electrostrictive elements has a multi-layered piezoelectric/electrostrictive operating portion.

20. A piezoelectric/electrostrictive device according to claim 2, wherein said third piezoelectric/electrostrictive element is formed on said second thin plate portion.

21. A piezoelectric/electrostrictive device according to claim 3, wherein two of the piezoelectric/electrostrictive elements that are provided mutually opposed on the outer surface of the same thin plate portion have different functions.

22. A piezoelectric/electrostrictive device according to claim 3, further comprising, on an outer surface of said second thin plate portion, a fourth piezoelectric/electrostrictive element comprising one or more pairs of electrodes and a ceramic piezoelectric/electrostrictive film, one end of said fourth piezoelectric/electrostrictive element and a piezoelectric/electrostrictive operating portion thereof at said one end are arranged on the fixing portion and extend to at least a part of said second thin plate portion, and an opposite end of said piezoelectric/electrostrictive operating portion of said fourth piezoelectric/electrostrictive element is arranged on said second thin plate portion, such that said fourth piezoelectric/electrostrictive element is mutually opposed to said third piezoelectric/electrostrictive element in a diagonal direction across said hole.

23. A piezoelectric/electrostrictive device according to claim 20, further comprising, on an outer surface of said first thin plate portion, a fourth piezoelectric/electrostrictive element comprising one or more pairs of electrodes and a ceramic piezoelectric/electrostrictive film, one end of said fourth piezoelectric/electrostrictive element and a piezoelectric/electrostrictive operating portion thereof at said one end are arranged on the movable portion and extend to at least a part of said first thin plate portion, and an opposite end of said piezoelectric/electrostrictive operating portion of said fourth piezoelectric/electrostrictive element is arranged on said first thin plate portion, such that said fourth piezoelectric/electrostrictive element is mutually opposed to said third piezoelectric/electrostrictive element in a diagonal direction across said hole.

* * * * *